United States Patent
Morita et al.

(10) Patent No.: US 12,168,709 B2
(45) Date of Patent: Dec. 17, 2024

(54) THERMOSETTING RESIN COMPOSITION, PREPREG, LAMINATE, METAL-CLAD LAMINATE, PRINTED WIRING BOARD, AND HIGH-SPEED COMMUNICATION COMPATIBLE MODULE

(71) Applicant: Resonac Corporation, Tokyo (JP)

(72) Inventors: Koji Morita, Tokyo (JP); Ryo Shimokawa, Tokyo (JP); Shinji Tsuchikawa, Tokyo (JP); Keiichi Kasuga, Tokyo (JP); Chihiro Hayashi, Tokyo (JP); Tomio Iwasaki, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 18/260,382

(22) PCT Filed: Dec. 17, 2021

(86) PCT No.: PCT/JP2021/046797
§ 371 (c)(1),
(2) Date: Jul. 5, 2023

(87) PCT Pub. No.: WO2022/149440
PCT Pub. Date: Jul. 14, 2022

(65) Prior Publication Data
US 2024/0092958 A1    Mar. 21, 2024

(30) Foreign Application Priority Data

| Jan. 6, 2021 | (JP) | ................... 2021-001039 |
| Jan. 6, 2021 | (JP) | ................... 2021-001044 |
| Jan. 6, 2021 | (JP) | ................... 2021-001049 |

(51) Int. Cl.
*C08F 283/04*    (2006.01)

(52) U.S. Cl.
CPC .................. *C08F 283/04* (2013.01)

(58) Field of Classification Search
CPC .................................................. C08F 283/04
USPC ..................................................... 428/195.1
See application file for complete search history.

(56) References Cited

U.S. PATENT DOCUMENTS

| 2005/0042466 A1* | 2/2005 | Ohno ....................... C08L 71/12 |
| | | 526/333 |
| 2010/0143728 A1* | 6/2010 | Tsuchikawa ......... H05K 1/0373 |
| | | 428/457 |
| 2012/0276392 A1* | 11/2012 | Takahashi ................ C08J 5/249 |
| | | 156/60 |
| 2017/0260364 A1 | 9/2017 | Hsieh |
| 2018/0030242 A1* | 2/2018 | Ebihara ................ C08K 5/3445 |

FOREIGN PATENT DOCUMENTS

| CN | 103756315 A | 4/2014 |
| JP | 5869046 A | 4/1983 |
| JP | S58-69046 A | 4/1983 |
| JP | S6-118937 A | 1/1986 |
| JP | 2016-222837 A | 12/2016 |
| JP | 2017-115020 A | 6/2017 |
| JP | 2020-169274 A1 | 10/2020 |
| WO | 2014/065350 A1 | 5/2014 |
| WO | 2016/175325 A1 | 11/2016 |

OTHER PUBLICATIONS

NKC's Resin List; Nippon Kayaku (Year: 2024).*

* cited by examiner

*Primary Examiner* — Betelhem Shewareged
(74) *Attorney, Agent, or Firm* — FITCH, EVEN, TABIN & FLANNERY LLP

(57) ABSTRACT

A thermosetting resin composition containing a maleimide compound (a) having at least one N-substituted maleimide group, and a compound (b) represented by the following general formula (1) exhibiting no reactivity with the maleimide group of the component (a) ($X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5).

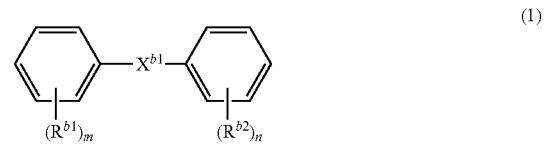

(1)

20 Claims, No Drawings

THERMOSETTING RESIN COMPOSITION, PREPREG, LAMINATE, METAL-CLAD LAMINATE, PRINTED WIRING BOARD, AND HIGH-SPEED COMMUNICATION COMPATIBLE MODULE

CROSS-REFERENCE TO RELATED APPLICATIONS

This application is a U.S. national phase application filed under 35 U.S.C. § 371 of International Application No. PCT/JP2021/046797, filed Dec. 17, 2021, designating the United States, which claims priority from Japanese Application No. 2021-001039, filed Jan. 6, 2021, Japanese Application No. 2021-001044, filed Jan. 6, 2021, and Japanese Application No. 2021-001049, filed Jan. 6, 2021, which are incorporated herein by reference in their entireties.

TECHNICAL FIELD

The present disclosure relates to a thermosetting resin composition, a prepreg, a laminate, a metal-clad laminate, a printed wiring board, and a high-speed communication compatible module.

BACKGROUND ART

The increase of the speed and capacity of signals used in various electronic equipments, for example, a mobile communication device represented by a cellular phone, a base station equipment thereof, a network infrastructure equipment, such as a server and a router, and a large-scale computer, has been becoming significant every year. Printed wiring boards mounted in the electronic equipments are thereby required to cope with high frequency waves, and a board material that is excellent in dielectric characteristics in a high frequency band capable of reducing the transmission loss (i.e., a low relative permeability and a low dielectric tangent in a high frequency band, which may be hereinafter referred to as high frequency characteristics) is being demanded. As the applications handling high frequency signals, in recent years, the practical realization and plans therefor of novel systems handling high frequency signals are promoted in the ITS field, such as automobiles and transportation systems, and the indoor near field communication field, in addition to the electronic devices described above, and it is expected that a board material having a low transmission loss is demanded also in the printed wiring boards mounted on these devices in the future.

A thermoplastic polymer excellent in high frequency characteristics has been used in a printed wiring board required to have a low transmission loss. For example, there has been a known method using a polyphenylene ether as a thermoplastic polymer and a thermosetting resin in combination. Specifically, a resin composition containing a polyphenylene ether and an epoxy resin (see, for example, PTL 1), a resin composition containing a polyphenylene ether and a cyanate resin having a lower relative permeability among thermosetting resins (see, for example, PTL 2), and the like have been known.

CITATION LIST

Patent Literatures

PTL 1: JP 58-069046 A
PTL 2: JP 61-018937 B

SUMMARY OF INVENTION

Technical Problem

However, there is a problem that the thermoplastic polymer lowers the heat resistance of the resin composition due to the low compatibility thereof with the other resins, and also a problem that the resin composition undergoes separation between the thermoplastic polymer and the other resins, deteriorating the handleability.

Accordingly, there is a significantly large industrial merit in an improvement of the dielectric characteristics in a high frequency band by a method other than the use of the thermoplastic polymer mixed therein. However, the present disclosure does not deny the use of the thermoplastic polymer mixed therein.

In view of the current situation, an object of the present disclosure is to provide a thermosetting resin composition that is excellent in dielectric characteristics in a high frequency band, and to provide a prepreg, a laminate, a metal-clad laminate, a printed wiring board, and a high-speed communication compatible module, using the thermosetting resin composition.

Solution to Problem

As a result of the accumulated earnest investigations by the present inventors for achieving the object, it has been found that the object can be achieved by mixing a compound having a particular structure with a thermosetting resin composition containing a particular maleimide compound.

The present disclosure includes the following items [1] to [22].

[1] A thermosetting resin composition containing
a maleimide compound (a) having at least one N-substituted maleimide group, and
a compound (b) represented by the following general formula (1) exhibiting no reactivity with the maleimide group of the component (a):

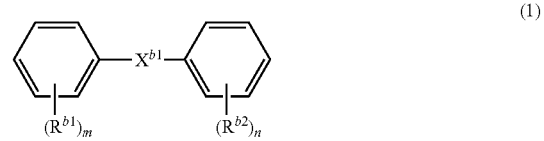

(1)

wherein in the general formula (1), $X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5.

[2] The thermosetting resin composition according to the item [1], wherein the component (a) contains a maleimide compound (a1) having at least two N-substituted maleimide groups.

[3] The thermosetting resin composition according to the item [1] or [2], wherein the component (a) contains a reaction product of a maleimide compound (a1) having at least two N-substituted maleimide groups, and at least one kind selected from the group consisting of a monoamine compound (a2) and an amine compound (a3) having at least two amino groups.

[4] The thermosetting resin composition according to the item [2] or [3], wherein the component (a1) is a maleimide compound having an aliphatic hydrocarbon group between nitrogen atoms of optional two N-substituted maleimide groups among the multiple N-substituted maleimide groups (provided that no aromatic hydrocarbon group exists), or a maleimide compound having an aromatic hydrocarbon group between nitrogen atoms of optional two N-substituted maleimide groups among the multiple N-substituted maleimide groups.

[5] The thermosetting resin composition according to the item [1] or [2], wherein the component (a) contains a reaction product of a maleimide compound (a1) having at least two N-substituted maleimide groups and a silicone compound (a3') having at least two amino groups.

[6] The thermosetting resin composition according to the item [5], wherein the component (a) is a reaction product of the component (a1), the component (a3'), and an amine compound (a3) having at least two amino groups (provided that the component (a3') is excluded).

[7] The thermosetting resin composition according to any one of the items [1] to [6], wherein the component (b) is represented by the following general formula (1'):

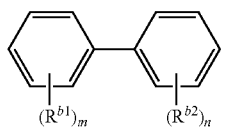

wherein in the general formula (1'), $R^{b1}$, $R^{b2}$, m, and n have the same meanings as in the general formula (1).

[8] The thermosetting resin composition according to any one of the items [1] to [7], wherein the component (b) has a boiling point of 260° C. or more under one atmosphere (101.325 kPa).

[9] The thermosetting resin composition according to any one of the items [1] to [8], wherein the component (b) is at least one kind selected from the group consisting of diethylbiphenyl and benzylbiphenyl.

[10] The thermosetting resin composition according to any one of the items [1] to [6] and [8], wherein in the general formula (1), $R^{b1}$ and $R^{b2}$ represent oxygen atom-containing groups.

[11] The thermosetting resin composition according to any one of the items [1] to [10], wherein the thermosetting resin composition has a content of the component (b) of 0.001 to 1.0 mol per 1 mol of the component (a).

[12] The thermosetting resin composition according to any one of the items [1] to [11], wherein the thermosetting resin composition further contains an inorganic filler (c).

[13] The thermosetting resin composition according to any one of the items [1] to [12], wherein the thermosetting resin composition further contains a thermosetting resin (d).

[14] The thermosetting resin composition according to any one of the items [1] to [13], wherein the thermosetting resin composition further contains a curing accelerator (e).

[15] The thermosetting resin composition according to any one of the items [1] to [14], wherein the thermosetting resin composition further contains a monoamine compound (f).

[16] The thermosetting resin composition according to any one of the items [1] to [15], wherein the thermosetting resin composition further contains an amine compound (g) having at least two amino groups.

[17] The thermosetting resin composition according to any one of the items [1] to [16], wherein the thermosetting resin composition further contains a silicone compound (g') having at least two amino groups.

[18] A prepreg containing a semi-cured material of the thermosetting resin composition according to any one of the items [1] to [17].

[19] A laminate containing a cured material of the prepreg according to the item [18].

[20] A metal-clad laminate including the laminate according to the item and a metal foil disposed on one surface or both surfaces thereof.

[21] A printed wiring board including the laminate according to the item or the metal-clad laminate according to the item [20], and a circuit formed thereon.

[22] A high-speed communication compatible module including the printed wiring board according to the item [21].

Advantageous Effects of Invention

The present disclosure can provide a thermosetting resin composition that is excellent in dielectric characteristics in a high frequency band, and a prepreg, a laminate, a metal-clad laminate, a printed wiring board, and a high-speed communication compatible module, using the same.

DESCRIPTION OF EMBODIMENTS

In the numerical ranges in the description herein, the upper limit values and the lower limit values of the numerical ranges each may be replaced by the values shown in the examples. The upper limit values and the lower limit values of the numerical ranges each may be optionally combined with the upper limit values and the lower limit values of the other numerical ranges.

In the description herein, for example, the description "10 or more" means 10 and a value exceeding 10, and the cases with other numerals are also in accordance therewith. Furthermore, for example, the description "10 or less" means 10 and a value less than 10, and the cases with other numerals are also in accordance therewith.

One kind of each of the components and the materials exemplified in the description herein may be used alone, or two or more kinds thereof may be used in combination, unless otherwise indicated. In the description herein, in the case where multiple substances corresponding to each of the components exist in the composition, the content of the component in the composition means the total amount of the multiple substances existing in the composition.

In the description herein, the "resin component" means the component (a) and the component (b), and the component (d), the component (f), the component (g), and the optional resin, which are used depending on necessity, and does not include the inorganic filler (c), the curing accelerator (e), the additives, and the like. The "solid content"

herein means the residual component excluding the volatile components from the components constituting the thermosetting resin composition.

In the description herein, the high frequency band means a band of 10 GHz or more.

Embodiments obtained by optionally combining the matters described in the description herein are also encompassed in the present embodiment.

[Thermosetting Resin Composition]

The thermosetting resin composition according to one embodiment (which may be hereinafter referred to as an "embodiment 1") of the present embodiment is a thermosetting resin composition containing a maleimide compound (a) having at least one N-substituted maleimide group (which may be hereinafter referred to as a component (a)), and a compound (b) represented by the following general formula (1) exhibiting no reactivity with the maleimide group of the component (a) (which may be hereinafter referred to as a component (b)).

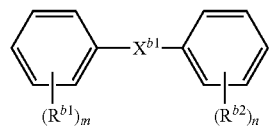

(1)

The groups in the general formula (1) have the meanings described later.

In the description herein, the expressions "thermosetting resin composition containing AA" and "thermosetting resin composition comprising AA" each encompass both a thermosetting resin composition that contains the components described in AA directly as they are, and a thermosetting resin composition that is obtained through reaction of at least a part of the components described in AA, and both the expressions have the same meaning.

The high frequency characteristics of the thermosetting resin composition can be enhanced by mixing the component (b) having the particular structure with the component (a). While the precise mechanism of this result obtained is unclear, the present inventors estimate as follows. The component (a) is likely oriented in the thermosetting resin composition, and creates a large dipole moment as molecules, through accumulation of the dipole moments of the oriented molecules. It has been considered that the followability thereof to the change of the external electric field is impaired thereby, resulting in deterioration of the dielectric characteristics. On the other hand, the component (b) hinders the orientation of the component (a) to reduce the number of the oriented molecules of the component (a), and thereby the accumulated dipole moments can be reduced. It is estimated that as a result, the followability to the change of the external electric field is improved, and the dielectric characteristics are enhanced.

The thermosetting resin composition of the present embodiment also has a characteristic feature that the excellent high frequency characteristics thereof are retained even after a hygroscopic test. In the following description, the "high frequency characteristics" also encompasses "high frequency characteristics after a hygroscopic test".

The thermosetting resin composition according to another embodiment (which may be hereinafter referred to as an "embodiment 2") of the present embodiment is a thermosetting resin composition containing a maleimide compound (a) having at least one N-substituted maleimide group, and a compound (b) represented by the general formula (1) exhibiting no reactivity with the maleimide group of the component (a), and the component (a) contains a reaction product (which may be hereinafter referred to as a silicone-modified maleimide resin (X)) of a maleimide compound (a1) having at least two N-substituted maleimide groups (which may be hereinafter referred to as a component (a1)) and a silicone compound (a3') having at least two amino groups (which may be hereinafter referred to as a component (a3')).

The thermosetting resin composition of the embodiment 2 is excellent in dielectric characteristics in a high frequency band, and also excellent in low warpage property due to the low elastic modulus thereof.

In the embodiment 2, the component (a) may also be a reaction product of the component (a1), the component (a3'), and an amine compound (a3) having at least two amino groups (which may be hereinafter referred to as a component (a3)). The component (a3) is not encompassed in the component (a3'), and the component (a3) and the component (a3') are different from each other.

The thermosetting resin composition according to still another embodiment (which may be hereinafter referred to as an "embodiment 3") of the present embodiment is a thermosetting resin composition containing a maleimide compound (a) having at least one N-substituted maleimide group (component (a)), a compound (b) represented by the following general formula (1) exhibiting no reactivity with the maleimide group of the component (a) (component (b)), and a silicone compound (g') having at least two amino groups (which may be hereinafter referred to as a component (g')).

The thermosetting resin composition of the embodiment 3 is excellent in dielectric characteristics in a high frequency band, and also excellent in low warpage property due to the low elastic modulus thereof.

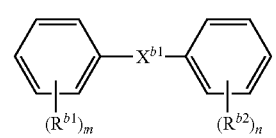

(1)

The groups in the general formula (1) have the meanings described later.

The components contained in the thermosetting resin composition of the present embodiment will be described in more detail below. The following description is common to all the embodiments 1 to 3 unless otherwise indicated.

<Maleimide Compound (a) Having at Least one N-substituted Maleimide Group>

The thermosetting resin composition of the present embodiment can be excellent in heat resistance and low thermal expansion property with the component (a) contained. The effects of the component (b) described above is conspicuously exhibited with the component (a) existing.

In the embodiment 1, the component (a) preferably contains a maleimide compound (a1) having at least two N-substituted maleimide groups (which may be hereinafter referred to as a component (a1)), more preferably contains the component (a1) in an amount of 50% by mass or more, further preferably contains the component (a1) in an amount of 80% by mass or more, and particularly preferably contains the component (a1) in an amount of 90% by mass or more, and the component (a) may be the component (a1) itself, from the standpoint of the heat resistance and the low thermal expansion property.

In the embodiment 1, the component (a) preferably contains a reaction product (which may be hereinafter referred to as a modified maleimide resin (A)) of the component (a1), and at least one kind selected from the group consisting of a monoamine compound (a2) (which may be hereinafter referred to as a component (a2)) and an amine compound (a3) having at least two amino groups from the standpoint of the heat resistance, the low thermal expansion property, and the adhesiveness to a metal foil. The component (a) more preferably contains the modified maleimide resin (A) in an amount of 50% by mass or more, further preferably 80% by mass or more, and particularly preferably 90% by mass or more, and the component (a) may be the modified maleimide resin (A) itself.

In the embodiment 1, an embodiment in which the component (a) contains the component (a1) and the modified maleimide resin (A) is also preferred. In this case, the total content of the component (a1) and the modified maleimide resin (A) in the component (a) is preferably 50% by mass or more, more preferably 80% by mass or more, further preferably 90% by mass or more, and particularly preferably substantially 100% by mass.

In the embodiments 2 and 3, the component (a) more preferably contains the silicone-modified maleimide resin (X) in an amount of 50% by mass or more, further preferably 80% by mass or more, and particularly preferably 90% by mass or more, and the component (a) may be the silicone-modified maleimide resin (X) itself.

In the embodiments 2 and 3, an embodiment in which the component (a) contains the component (a1) and the silicone-modified maleimide resin (X) is also preferred. In this case, the total content of the component (a1) and the silicone-modified maleimide resin (X) in the component (a) is preferably 50% by mass or more, more preferably 80% by mass or more, further preferably 90% by mass or more, and particularly preferably substantially 100% by mass.

(Maleimide Compound (a1) Having at Least two N-Substituted Maleimide Groups)

Examples of the component (a1) include a maleimide compound having an aliphatic hydrocarbon group between the nitrogen atoms of optional two N-substituted maleimide groups among the multiple N-substituted maleimide groups (provided that no aromatic hydrocarbon group exists) (which may be hereinafter referred to as an aliphatic hydrocarbon group-containing maleimide compound), and a maleimide compound having an aromatic hydrocarbon group between the nitrogen atoms of optional two N-substituted maleimide groups among the multiple N-substituted maleimide groups (which may be hereinafter referred to as an aromatic hydrocarbon group-containing maleimide compound). Among these, the aromatic hydrocarbon group-containing maleimide compound is preferred from the standpoint of the high heat resistance, the high frequency characteristics, the high adhesiveness to a metal foil, the high glass transition temperature, the low thermal expansion property, and the moldability. It suffices that the aromatic hydrocarbon group-containing maleimide compound contains an aromatic hydrocarbon group between any combination of two maleimide groups that are optionally selected, and may have an aliphatic hydrocarbon group in addition to the aromatic hydrocarbon group.

The component (a1) is preferably a maleimide compound having 2 to 5 N-substituted maleimide groups in one molecule, and more preferably a maleimide compound having 2 N-substituted maleimide groups in one molecule, from the standpoint of the high heat resistance, the high frequency characteristics, the high adhesiveness to a metal foil, the high glass transition temperature, the low thermal expansion property, and the moldability.

The component (a1) is further preferably a maleimide compound represented by the following general formula (a1-1) from the standpoint of the high heat resistance, the high frequency characteristics, the high adhesiveness to a metal foil, the high glass transition temperature, the low thermal expansion property, and the moldability.

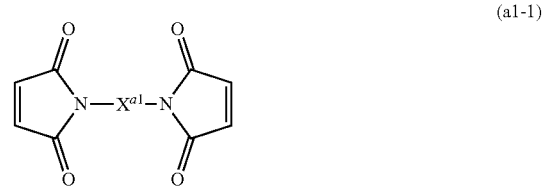

(a1-1)

In the formula, $X^{a1}$ represents a group represented by the following general formula (a1-2), (a1-3), (a1-4), or (a1-5).

(a1-2)

In the formula, $R^{a1}$ each independently represent an aliphatic hydrocarbon group having 1 to 5 carbon atoms or a halogen atom; and p1 represents an integer of 0 to 4.

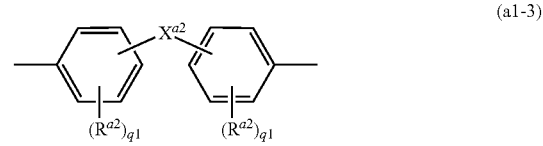

(a1-3)

In the formula, $R^{a2}$ each independently represent an aliphatic hydrocarbon group having 1 to 5 carbon atoms or a halogen atom; $X^{a2}$ represents an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (a1-3'); and q1 each independently represent an integer of 0 to 4.

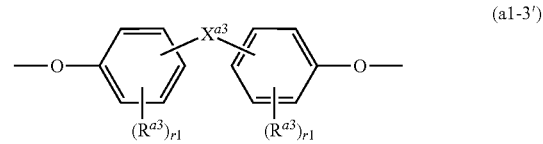

(a1-3')

In the formula, $R^{a3}$ each independently represent an aliphatic hydrocarbon group having 1 to 5 carbon atoms or a halogen atom; $X^{a3}$ represents an alkylene group having 1 to 5 carbon atoms, an alkylidene group having 2 to 5 carbon atoms, an ether group, a sulfide group, a sulfonyl group, a carbonyloxy group, a keto group, or a single bond; and r1 each independently represent an integer of 0 to 4.

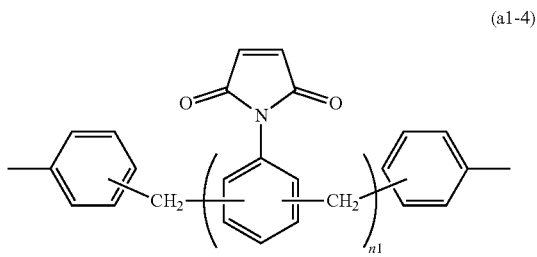

(a1-4)

In the formula, n1 represents an integer of 1 to 10.

(a1-5)

In the formula, $R^{a4}$ each independently represent a hydrogen atom or an aliphatic hydrocarbon group having 1 to 5 carbon atoms; and u1 represents an integer of 1 to 8.

The groups in the general formulae will be described below.

In the general formula (a1-2), examples of the aliphatic hydrocarbon group having 1 to 5 carbon atoms represented by $R^{a1}$ include a methyl group, an ethyl group, a n-propyl group, an isopropyl group, a n-butyl group, an isobutyl group, a t-butyl group, and a n-pentyl group. Examples of the halogen atom include a fluorine atom, a chlorine atom, a bromine atom, and an iodine atom.

$R^{a1}$ preferably represents an aliphatic hydrocarbon group.

p1 represents an integer of 0 to 4, and from the standpoint of the availability, preferably represents an integer of 0 to 2, and more preferably 0. In the case where p1 represents an integer of 2 or more, the multiple groups represented by $R^{a1}$ may be the same as or different from each other.

In the general formula (a1-3), examples of the aliphatic hydrocarbon group having 1 to 5 carbon atoms and the halogen atom represented by $R^{a2}$ include the same ones as represented by $R^{a1}$. The aliphatic hydrocarbon group is preferably an aliphatic hydrocarbon group having 1 to 3 carbon atoms, more preferably a methyl group or an ethyl group, and further preferably an ethyl group.

$R^{a2}$ preferably represents an aliphatic hydrocarbon group having 1 to 5 carbon atoms.

Examples of the alkylene group having 1 to 5 carbon atoms represented by $X^{a2}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms, and more preferably a methylene group.

Examples of the alkylidene group having 2 to 5 carbon atoms represented by $X^{a2}$ include an ethylidene group, a propylidene group, an isopropylidene group, a butylidene group, an isobutylidene group, a pentylidene group, and an isopentylidene group. Among these, an isopropylidene group is preferred.

$X^{a2}$ preferably represents an alkylene group having 1 to 5 carbon atoms, an alkylidene group having 2 to 5 carbon atoms, or a group represented by the general formula (a1-3'), and more preferably represents a group represented by the general formula (a1-3'), among the options described above.

q1 each independently represent an integer of 0 to 4, and from the standpoint of the availability, preferably represent an integer of 0 to 2, and more preferably 0 or 2. In the case where q1 represents an integer of 2 or more, the multiple groups represented by $R^{a2}$ may be the same as or different from each other.

In the general formula (a1-3'), examples of the aliphatic hydrocarbon group having 1 to 5 carbon atoms and the halogen atom represented by $R^{a1}$ include the same ones as represented by $R^{a2}$.

Examples of the alkylene group having 1 to 5 carbon atoms and the alkylidene group having 2 to 5 carbon atoms represented by $X^{a3}$ include the same ones for the alkylene group having 1 to 5 carbon atoms and the alkylidene group having 2 to 5 carbon atoms represented by $X^{a2}$.

$X^{a3}$ preferably represents an alkylidene group having 2 to 5 carbon atoms, and more preferably an isopropylidene group, among the options described above.

r1 each independently represent an integer of 0 to 4, and from the standpoint of the availability, preferably represent an integer of 0 to 2, and more preferably 0. In the case where r1 represents an integer of 2 or more, the multiple groups represented by $R^{a1}$ may be the same as or different from each other.

In the general formula (a1-4), n1 shows the number of repeating units of the structural unit in the parentheses, specifically represents an integer of 1 to 10, and from the standpoint of the availability, preferably represents an integer of 1 to 5, and more preferably an integer of 1 to 3.

In the general formula (a1-5), examples of the aliphatic hydrocarbon group having 1 to 5 carbon atoms and the halogen atom represented by $R^{a4}$ include the same ones as represented by $R^{a1}$ in the general formula (a1-2), and the preferred examples of the aliphatic hydrocarbon group having 1 to 5 carbon atoms and the halogen atom represented by $R^{a4}$ are also the same as in $R^{a1}$. The multiple groups represented by $R^{a4}$ bonded to the same carbon atom may be the same as or different from each other.

u1 shows the number of repeating units of the structural unit in the parentheses, specifically represents an integer of 1 to 8, preferably an integer of 1 to 3, and more preferably 1. In the case where u1 represents an integer of 2 or more, the multiple groups represented by $R^{a4}$ may be the same as or different from each other.

In the general formula (a1-1), $X^{a1}$ preferably represents a group represented by any of the following formulae from the standpoint of the high heat resistance, the high frequency characteristics, the high adhesiveness to a metal foil, the high glass transition temperature, the low thermal expansion property, and the moldability.

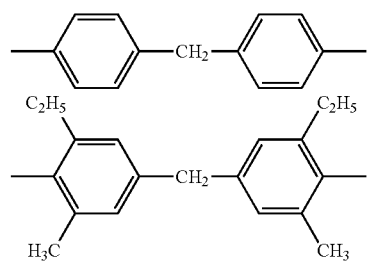

-continued

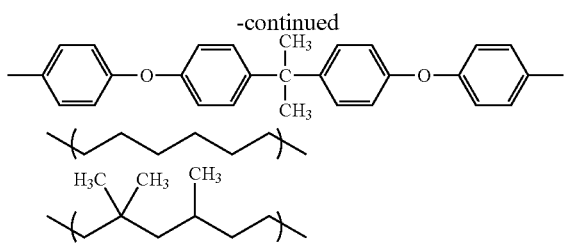

The component (a1) is preferably a maleimide compound, in which $X^{a1}$ in the general formula (a1-1) represents a group represented by the general formula (a1-3), and more preferably a compound, in which $X^{a1}$ in the general formula (a1-1) represents a group represented by the general formula (a1-3), and $X^{a2}$ in the general formula (a1-3) represents a group represented by the general formula (a1-3').

Examples of the component (a1) include N,N'-ethylenebismaleimide, N,N'-hexamethylenebismaleimide, N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimidophenyl)methane, bis(3-methyl-4-maleimidophenyl)methane, 3,3'-dimethyl-5,5'-diethyl-4,4'-diphenylmethanebismaleimide, bis(4-maleimidophenyl) ether, bis(4-maleimidophenyl) sulfone, bis(4-maleimidophenyl) sulfide, bis(4-maleimidophenyl) ketone, bis(4-maleimidocyclohexyl)methane, 1,4-bis(4-maleimidophenyl)cyclohexane, 1,4-bis(maleimidomethyl)cyclohexane, 1,4-bis(maleimidomethyl)benzene, 1,3-bis(4-maleimidophenoxy)benzene, 1,3-bis(3-maleimidophenoxy)benzene, bis[4-(3-maleimidophenoxy)phenyl]methane, bis[4-(4-maleimidophenoxy)phenyl]methane, 1,1-bis[4-(3-maleimidophenoxy)phenyl]ethane, 1,1-bis[4-(4-maleimidophenoxy)phenyl]ethane, 1,2-bis[4-(3-maleimidophenoxy)phenyl]ethane, 1,2-bis[4-(4-maleimidophenoxy)phenyl]ethane, 2,2-bis[4-(3-maleimidophenoxy)phenyl]propane, 2,2-bis[4-(4-maleimidophenoxy)phenyl]propane, 2,2-bis[4-(3-maleimidophenoxy)phenyl]butane, 2,2-bis[4-(4-maleimidophenoxy)phenyl]butane, 2,2-bis[4-(3-maleimidophenoxy)phenyl]-1,1,1,3,3,3-hexafluoropropane, 2,2-bis[4-(4-maleimidophenoxy)phenyl]-1,1,1,3,3,3-hexafluoropropane, 4,4'-bis(3-maleimidophenoxy)biphenyl, 4,4'-bis(4-maleimidophenoxy)biphenyl, a biphenyl aralkyl type maleimide, bis[4-(3-maleimidophenoxy)phenyl] ketone, bis[4-(4-maleimidophenoxy)phenyl]ketone, 2,2'-bis(4-maleimidophenyl) disulfide, bis[4-(3-maleimidophenoxy)phenyl]sulfide, bis[4-(4-maleimidophenoxy)phenyl]sulfide, bis[4-(3-maleimidophenoxy)phenyl]sulfoxide, bis[4-(4-maleimidophenoxy)phenyl]sulfoxide, bis[4-(3-maleimidophenoxy)phenyl]sulfone, bis[4-(4-maleimidophenoxy)phenyl]sulfone, bis[4-(3-maleimidophenoxy)phenyl]ether, bis[4-(4-maleimidophenoxy)phenyl]ether, 1,4-bis[4-(4-maleimidophenoxy)-α,α-dimethylbenzyl]benzene, 1,3-bis[4-(4-maleimidophenoxy)-α,α-dimethylbenzyl]benzene, 1,4-bis[4-(3-maleimidophenoxy)-α,α-dimethylbenzyl]benzene, 1,3-bis[4-(3-maleimidophenoxy)-α,α-dimethylbenzyl]benzene, 1,4-bis[4-(4-maleimidophenoxy)-3,5-dimethyl-α,α-dimethylbenzyl]benzene, 1,3-bis[4-(4-maleimidophenoxy)-3,5-dimethyl-α,α-dimethylbenzyl]benzene, 1,4-bis[4-(3-maleimidophenoxy)-3,5-dimethyl-α,α-dimethylbenzyl]benzene, 1,3-bis[4-(3-maleimidophenoxy)-3,5-dimethyl-α,α-dimethylbenzyl]benzene, and polyphenylmethanemaleimide (for example, BMI-2300, trade name, available from Daiwa Fine Chemicals Co., Ltd.). One kind of the component (a1) may be used alone, or two or more kinds thereof may be used in combination.

Among these, the component (a1) is preferably bis(4-maleimidophenyl)methane, bis(4-maleimidophenyl) sulfone, 3,3'-dimethyl-5,5'-diethyl-4,4'-diphenylmethanebismaleimide, or 2,2-bis[4-(4-maleimidophenoxy)phenyl]propane, and more preferably 2,2-bis[4-(4-maleimidophenoxy)phenyl]propane, from the standpoint of the achievement of the high reaction rate and higher heat resistance. From the standpoint of the solubility in an organic solvent, 3,3'-dimethyl-5,5'-diethyl-4,4'-diphenylmethanebismaleimide, bis(4-maleimidophenyl)methane, and polyphenylmethanemaleimide are preferred, and from the standpoint of the low cost, bis(4-maleimidophenyl)methane is preferred.

(Monoamine Compound (a2))

The heat resistance, the low thermal expansion property, and the like can be further enhanced by reacting the component (a2) with the component (a1).

The component (a2) is not particularly limited, as far as being a compound having one amino group, in which a monoamine compound having an acidic substituent is preferred, and a compound represented by the following general formula (a2-1) is more preferred, from the standpoint of the high heat resistance, the high frequency characteristics, the high adhesiveness to a metal foil, the high glass transition temperature, the low thermal expansion property, and the moldability.

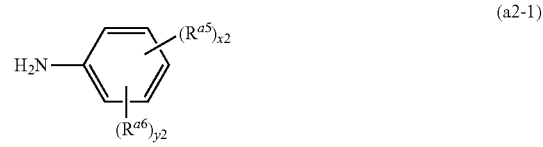

(a2-1)

In the formula, $R^{a5}$ each independently represent a hydroxy group, a carboxy group, or a sulfonic group, i.e., an acidic substituent; $R^{a6}$ each independently represent an aliphatic hydrocarbon group having 1 to 5 carbon atoms or a halogen atom; x2 represents an integer of 1 to 5; and y2 represents an integer of 0 to 4, provided that $1 \le x2+y2 \le 5$ is satisfied.

In the general formula (a2-1), the acidic substituent represented by $R^{a5}$ is preferably a hydroxy group or a carboxy group from the standpoint of the solubility and the reactivity, and is more preferably a hydroxy group further in consideration of the heat resistance.

x2 represents an integer of 1 to 5, and preferably represents an integer of 1 to 3, more preferably 1 or 2, and further preferably 1, from the standpoint of the high heat resistance, the low relative permeability, the high glass transition temperature, the low thermal expansion property, and the moldability.

Examples of the alkyl group having 1 to 5 carbon atoms represented by $R^{a6}$ include a methyl group, an ethyl group, a n-propyl group, an isopropyl group, a n-butyl group, an isobutyl group, a t-butyl group, and a n-pentyl group. The alkyl group is preferably an alkyl group having 1 to 3 carbon atoms.

Examples of the halogen atom represented by $R^{a6}$ include a fluorine atom, a chlorine atom, a bromine atom, and iodine atom.

y2 represents an integer of 0 to 4, and is preferably an integer of 0 to 3, more preferably an integer of 0 to 2, further preferably 0 or 1, and particularly preferably 0, from the standpoint of the high heat resistance, the low relative permeability, the high glass transition temperature, the low thermal expansion property, and the moldability.

In the case where x2 represents an integer of 2 or more, the multiple groups represented by $R^{a5}$ may be the same as or different from each other. In the case where y2 represents an integer of 2 or more, the multiple groups represented by Ra b may be the same as or different from each other.

Examples of the component (a2) include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesufonic acid, 3,5-dihydroxyaniline, and 3,5-dicarboxyaniline. Among these, m-aminophenol, p-aminophenol, o-aminophenol, p-aminobenzoic acid, m-aminobenzoic acid, and 3,5-dihydroxyaniline are preferred from the standpoint of the solubility and the synthesis yield, m-aminophenol and p-aminophenol are more preferred from the standpoint of the heat resistance, and p-aminophenol is further preferred from the standpoint of the low thermal expansion property.

One kind of the monoamine compound (a2) may be used alone, or two or more kinds thereof may be used in combination.

(Amine Compound (a3) Having at Least two Amino Groups)

The component (a3) is preferably an amine compound having an amino group at least one of the molecular ends, and more preferably an amine compound having amino groups at both molecular ends. An amine compound having an amino group on the side chain may be used, and an amine compound having amino groups on the side chain and at least one of the molecular ends may also be used. The component (a3) may be a compound having a siloxane skeleton, or may be a compound having no siloxane skeleton. Examples of the compound having a siloxane skeleton include a silicone compound (a3') having at least two amino groups. The silicone compound (a3') having at least two amino groups is a compound that is used in the embodiment 2, and will be described later.

The amino groups described above each are preferably a primary amino group.

Among these, an amine compound having amino groups at both molecular ends is preferred, and preferred examples of this amine compound include a diamine compound represented by the following general formula (a3-1) from the standpoint of the high heat resistance, the high frequency characteristics, the high adhesiveness to a metal foil, the high glass transition temperature, the low thermal expansion property, and the moldability.

$$H_2N-X^{a4}-NH_2 \quad (a3\text{-}1)$$

In the general formula (a3-1), $X^{a4}$ represents a group represented by the following general formula (a3-2), (a3-3), or (a3-4).

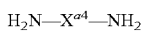

(a3-2)

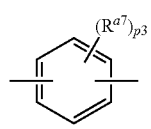

In the general formula (a3-2), $R^{a7}$ each independently represent an aliphatic hydrocarbon group having 1 to 5 carbon atoms or a halogen atom; and p3 represents an integer of 0 to 4.

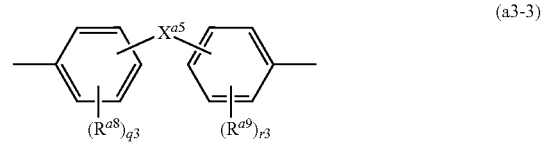

(a3-3)

In the general formula (a3-3), $R^{a8}$ and $R^{a9}$ each independently represent an aliphatic hydrocarbon group having 1 to 5 carbon atoms or a halogen atom; X a5 represents an alkylene group having 1 to 5 carbon atoms, an alkylidene group having 2 to 5 carbon atoms, an ether group, a sulfide group, a sulfonyl group, a carbonyloxy group, a keto group, a single bond, a group represented by the following general formula (a3-3-1), or a group represented by the following general formula (a3-3-2); and q3 and r3 each independently represent an integer of 0 to 4.

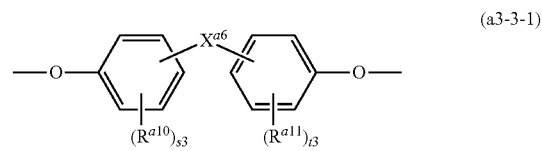

(a3-3-1)

In the general formula (a3-3-1), $R^{a10}$ and $R^{a11}$ each independently represent an aliphatic hydrocarbon group having 1 to 5 carbon atoms or a halogen atom; $X^{a6}$ represents an alkylene group having 1 to 5 carbon atoms, an alkylidene group having 2 to 5 carbon atoms, an ether group, a sulfide group, a sulfonyl group, a carbonyloxy group, a keto group, or a single bond; and s3 and t3 each independently represent an integer of 0 to 4.

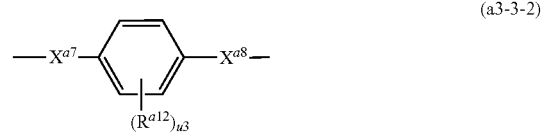

(a3-3-2)

In the general formula (a3-3-2), $R^{a12}$ represents an aliphatic hydrocarbon group having 1 to 5 carbon atoms or a halogen atom; $X^{a7}$ and $X^{a8}$ each independently represent an alkylene group having 1 to 5 carbon atoms, an alkylidene group having 2 to 5 carbon atoms, an ether group, or a single bond; and u3 represents an integer of 0 to 4.

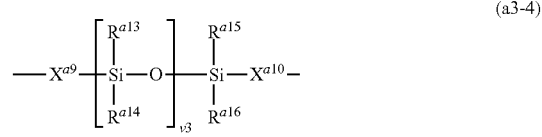

(a3-4)

In the general formula (a3-4), $R^{a13}$ to $R^{a16}$ each independently represent an alkyl group having 1 to 5 carbon atoms, a phenyl group, or a substituted phenyl group; $X^{a9}$ and $X^{a10}$ each independently represent a divalent organic group; and v3 represents an integer of 1 to 100.

In the general formula (a3-2), examples of the aliphatic hydrocarbon group represented by $R^{a7}$ include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, and more preferably a methyl group. Examples of the halogen atom include a fluorine atom, a chlorine atom, a bromine atom, and an iodine atom.

Among the above, $R^{a7}$ preferably represents an aliphatic hydrocarbon group having 1 to 5 carbon atoms.

p3 represents an integer of 0 to 4, and from the standpoint of the availability, preferably represents an integer of 0 to 2, and more preferably 2. In the case where p3 represents an integer of 2 or more, the multiple groups represented by Ra z may be the same as or different from each other.

In the general formula (a3-3), examples of the aliphatic hydrocarbon group having 1 to 5 carbon atoms and the halogen atom represented by $R^{a8}$ and $R^{a9}$ include the same ones as represented by $R^{a7}$. The aliphatic hydrocarbon group is preferably an aliphatic hydrocarbon group having 1 to 3 carbon atoms, more preferably a methyl group or an ethyl group, and further preferably an ethyl group.

Examples of the alkylene group having 1 to 5 carbon atoms represented by $X^{a5}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms, and more preferably a methylene group, from the standpoint of the heat resistance and the low thermal expansion property.

Examples of the alkylidene group having 2 to 5 carbon atoms represented by $X^{a5}$ include an ethylidene group, a propylidene group, an isopropylidene group, a butylidene group, an isobutylidene group, a pentylidene group, and an isopentylidene group. Among these, an isopropylidene group is preferred from the standpoint of the heat resistance and the low thermal expansion property.

$X^{a5}$ preferably represents an alkylene group having 1 to 5 carbon atoms or an alkylidene group having 2 to 5 carbon atoms among the options described above. More preferred examples thereof have been described above.

q3 and r3 each independently represent an integer of 0 to 4, and from the standpoint of the availability, preferably represent an integer of 0 to 2, and more preferably 0 or 2. In the case where q3 or r3 represents an integer of 2 or more, the multiple groups represented by $R^{a8}$ or the multiple groups represented by $R^{a9}$ may be the same as or different from each other.

In the general formula (a3-3-1), examples of the aliphatic hydrocarbon group having 1 to 5 carbon atoms and the halogen atom represented by $R^{a10}$ and $R^{a11}$ include the same ones as represented by $R^{a8}$ and $R^{a9}$, and the preferred embodiments thereof are also the same.

Examples of the alkylene group having 1 to 5 carbon atoms and the alkylidene group having 2 to 5 carbon atoms represented by $X^{a6}$ include the same ones as for the alkylene group having 1 to 5 carbon atoms and the alkylidene group having 2 to 5 carbon atoms represented by $X^{a5}$.

$X^{a6}$ preferably represents an alkylidene group having 2 to 5 carbon atoms, and more preferably an isopropylidene group, among the options described above.

s3 and t3 each represent an integer of 0 to 4, and from the standpoint of the availability, each preferably represent an integer of 0 to 2, more preferably 0 or 1, and further preferably 0. In the case where s3 or t3 represents an integer of 2 or more, the multiple groups represented by $R^{a10}$ or the multiple groups represented by $R^{a11}$ may be the same as or different from each other.

In the general formula (a3-3-2), examples of the aliphatic hydrocarbon group having 1 to 5 carbon atoms and the halogen atom represented by $R^{a12}$ include the same ones as represented by $R^{a10}$ and $R^{a11}$, and the preferred embodiments thereof are also the same.

Examples of the alkylene group having 1 to 5 carbon atoms and the alkylidene group having 2 to 5 carbon atoms represented by $X^{a7}$ and $X^{a8}$ include the same ones as represented by $X^{a6}$, and the preferred embodiments thereof are also the same. u3 represents an integer of 0 to 4, and from the standpoint of the availability, preferably represents an integer of 0 to 2, more preferably 0 or 1, and further preferably 0. In the case where u3 represents an integer of 2 or more, the multiple groups represented by $R^{a12}$ may be the same as or different from each other.

In the general formula (a3-4), examples of the alkyl group having 1 to 5 carbon atoms represented by $R^{a13}$ to $R^{a16}$ include a methyl group, an ethyl group, a n-propyl group, an isopropyl group, a n-butyl group, an isobutyl group, a t-butyl group, and a n-pentyl group. The alkyl group is preferably an alkyl group having 1 to 3 carbon atoms, and more preferably a methyl group.

In the substituted phenyl group represented by $R^{a13}$ to $R^{a16}$, examples of the substituent of the phenyl group include an alkyl group having 1 to 5 carbon atoms, an alkenyl group having 2 to 5 carbon atoms, and an alkynyl group having 2 to 5 carbon atoms. Examples of the alkyl group having 1 to 5 carbon atoms include a methyl group, an ethyl group, a n-propyl group, an isopropyl group, a n-butyl group, an isobutyl group, a t-butyl group, and a n-pentyl group. Examples of the alkenyl group having 2 to 5 carbon atoms include a vinyl group and an allyl group. Examples of the alkynyl group having 2 to 5 carbon atoms include an ethynyl group and a propargyl group.

$R^{a13}$ to $R^{a16}$ each preferably represent an alkyl group having 1 to 5 carbon atoms, and more preferably a methyl group.

Examples of the divalent organic group represented by $X^{a9}$ and $X^{a10}$ include an alkylene group, an alkenylene group, an alkynylene group, an arylene group, —O—, and a divalent linking group containing these groups in combination. Examples of the alkylene group include an alkylene group having 1 to 10 carbon atoms, such as a methylene group, an ethylene group, and a propylene group. Examples of the alkenylene group include an alkenylene group having 2 to 10 carbon atoms. Examples of the alkynylene group include an alkynylene group having 2 to 10 carbon atoms. Examples of the arylene group include an arylene group having 6 to 20 carbon atoms, such as a phenylene group and a naphthylene group.

v3 shows the number of repeating units of the structural unit in the brackets, specifically represents an integer of 1 to 100, may represent an integer of 2 to 100, may represent an integer of 5 to 100, may represent an integer of 10 to 100, may represent an integer of 15 to 70, and may represent an integer of 20 to 50.

The component (a3) is preferably a diamine compound, in which $X^{a4}$ in the general formula (a3-1) represents a group represented by the general formula (a3-3), and more preferably a diamine compound, in which $X^{a4}$ in the general formula (a3-1) represents a group represented by the general formula (a3-3), and $X^{a5}$ in the general formula (a3-3) represents a group represented by the general formula (a3-3-2).

Specific examples of the component (a3) include 4,4'-(1,3-phenylenediisopropylidene)bisaniline, diaminobenzidine, diaminodiphenylmethane, diaminodiphenyl ether, diaminodiphenyl sulfone, 4,4'-methylenebis(2-chloroaniline), 1,3'-bis(4-aminophenoxy)benzene, 2,2'-bis[4-(4-aminophenoxy)phenyl]propane, bis[4-(4-aminophenoxy)phenyl]sulfone, bis[4-(3-aminophenoxy)phenyl]sulfone, 2,2'-bis[4-(4-aminophenoxy)phenyl]hexafluoropropane, 1,4'-bis(4-aminophenoxy)benzene, 4,4'-diaminodiphenyl sulfide, 4,4'-diamino-3,3'-biphenyldiol, 9,9'-bis(4-aminophenyl)fluorene, and o-tolidine sulfone.

Among these, 4,4'-(1,3-phenylenediisopropylidene)bisaniline is preferred while not limited.
(Silicone Compound (a3') Having at Least Two Amino Groups)

The component (a3') is not particularly limited as far as being a silicone compound having at least two amino groups, in which a silicone compound having two amino groups in one molecule is preferred, and a silicone compound having two primary amino groups in one molecule is more preferred.

It suffices that the component (a3') has amino group (preferably primary amino groups) at one or both of the side chain and the end of the siloxane skeleton, and from the standpoint of the availability and the low warpage property, preferably at the end thereof, and more preferably at both ends thereof (hereinafter the silicone compound having amino groups (preferably primary amino groups) at both ends thereof may be referred to as a "both-end amino-modified silicone compound"). The component (a3') is preferably represented by the following general formula (a3'-1) from the same standpoint as above.

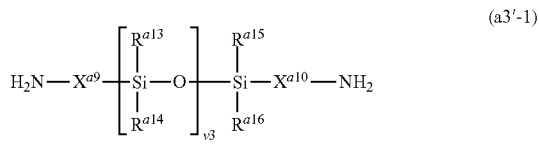

(a3'-1)

in the general formula (a3'-1), $R^{a13}$ to $R^{a16}$, $X^{a9}$, $X^{a10}$, and v3 have the same meanings as in the general formula (a3-4), and the preferred embodiments thereof are also the same.

The component (a3') used may be a commercially available product, and examples of the component (a3') having a methyl group on the side chain thereof include "KF-8010" (functional group equivalent of amino groups: 430 g/mol), "X-22-161A" (functional group equivalent of amino groups: 800 g/mol), "X-22-161B" (functional group equivalent of amino groups: 1,500 g/mol), "KF-8012" (functional group equivalent of amino groups: 2,200 g/mol), "KF-8008" (functional group equivalent of amino groups: 5,700 g/mol), and "X-22-9409" (functional group equivalent of amino groups: 700 g/mol) (all available from Shin-Etsu Chemical Co., Ltd.). Examples of the component (a3') having a phenyl group on the side chain thereof include "X-22-1660B-3" (functional group equivalent of amino groups: 2,200 g/mol) (available from Shin-Etsu Chemical Co., Ltd.), and "BY-16-853U" (functional group equivalent of amino groups: 460 g/mol), "BY-16-853" (functional group equivalent of amino groups: 650 g/mol), and "BY-16-853B" (functional group equivalent of amino groups: 2,200 g/mol)(all available from Down Corning Toray Co., Ltd.). One kind thereof may be used alone, or two or more kinds thereof may be used in combination.

Among these, the commercially available product of the component (a3') is preferably "X-22-161A", "X-22-161B", "KF-8012", "KF-8008", "X-22-1660B-3", or "BY-16-853B" from the standpoint of the low water absorption property, and more preferably "X-22-161A", "X-22-161B", "KF-8012", or "X-22-1660B-3" from the standpoint of the low thermal expansion property.

The functional group equivalent of amino groups of the component (a3') is preferably 300 to 3,000 g/mol, more preferably 400 to 2,500 g/mol, and further preferably 600 to 2,300 g/mol.

(Production Method of Modified Maleimide Resin (A) and Silicone-modified Maleimide Resin (X))

In the embodiment 1, the modified maleimide resin (A) contained as the component (a) can provide a tendency that the control of the molecular weight of the resin in the thermosetting resin composition can be facilitated, and the low thermal expansion property and the elastic modulus can be easily enhanced.

In the embodiments 2 and 3, the silicone-modified maleimide resin (X) contained as the component (a) can provide a tendency that the control of the molecular weight of the resin in the thermosetting resin composition can be facilitated, and the low thermal expansion property and the low warpage property can be easily enhanced.

The production method of the modified maleimide resin (A) is not particularly limited, and the modified maleimide resin (A) can be produced in such a manner that the amino group of the component (a2) and at least one of the amino groups of the component (a3) are addition-reacted with the carbon-carbon double bond of the maleimide group of the component (a1).

The production method of the silicone-modified maleimide resin (X) is not particularly limited, and the silicone-modified maleimide resin (X) can be produced in such a manner that the amino group of the component (a3') (and depending on necessity the amino group of the component (a3) (provided that the component (a3') is excluded)) is addition-reacted with the carbon-carbon double bond of the maleimide group of the component (a1).

The modified maleimide resin (A) and the silicone-modified maleimide resin (X) are preferably produced in an organic solvent under heating. The reaction temperature is not particularly limited, and is preferably 70 to 200° C., more preferably 70 to 150° C., and further preferably 100 to 130° C. The reaction time is not particularly limited, and is preferably 0.1 to 10 hours, and more preferably 1 to 6 hours.

A reaction catalyst may be used depending on necessity in the production of the modified maleimide resin (A) and the silicone-modified maleimide resin (X). The reaction catalyst is not particularly limited, and examples thereof include an amine compound, such as triethylamine, pyridine, and tributylamine; an imidazole-based compound, such as methylimidazole and phenylimidazole; and a phosphorus-based catalyst, such as triphenylphosphine. One kind thereof may be used alone, or two or more kinds thereof may be used in combination.

In the production of the modified maleimide resin (A), the number of maleimide groups of the component (a1) ((amount of component (a1) used (g))/(functional group equivalent of maleimide groups of component (a1) (g/eq))) is not particularly limited, and is preferably 0.1 to 10 times, more preferably 1 to 9 times, further preferably 1.1 to 9 times, and particularly preferably 2 to 8 times, the total of the number of amino groups of the component (a2) ((amount of component (a2) used (g))/(functional group equivalent of amino groups of component (a2) (g/eq))) and the number of amino groups of the component (a3) ((amount of component (a3) used (g))/(functional group equivalent of amino groups of component (a3) (g/eq))). In the case where the number of maleimide groups thereof is the lower limit value or more, and particularly 2 times or more, there is a tendency that the gelation is suppressed, and the heat resistance is improved, and in the case where the number of maleimide groups thereof is the upper limit value or less, there is a tendency that the solubility in an organic solvent and the heat resistance are improved.

Similarly, in the production of the silicone-modified maleimide resin (X), the number of maleimide groups of the component (a1) ((amount of component (a1) used (g))/(functional group equivalent of maleimide groups of component (a1) (g/eq))) is not particularly limited, and is preferably 0.1 to 10 times, more preferably 1 to 9 times, further preferably 1.1 to 9 times, and particularly preferably 2 to 8 times, the total of the number of amino groups of the component (a3') ((amount of component (a3') used (g))/(functional group equivalent of amino groups of component (a3') (g/eq))) and the number of amino groups of the component (a3) (provided that the component (a3') is excluded) ((amount of component (a3) used (g))/(functional group equivalent of amino groups of component (a3) (g/eq))). In the case where the number of maleimide groups thereof is the lower limit value or more, and particularly 2 times or more, there is a tendency that the gelation is suppressed, and the heat resistance is improved, and in the case where the number of maleimide groups thereof is the upper limit value or less, there is a tendency that the solubility in an organic solvent and the heat resistance are improved.

The modified maleimide resin (A) and the silicone-modified maleimide resin (X) are preferably produced in the presence of an organic solvent. The organic solvent is not particularly limited, and examples thereof include an alcohol-based solvent, such as ethanol, propanol, butanol, methyl cellosolve, butyl cellosolve, and propylene glycol monomethyl ether; a ketone-based solvent, such as acetone, methyl ethyl ketone, methyl isobutyl ketone, and cyclohexanone; an ether-based solvent, such as tetrahydrofuran; an aromatic-based solvent, such as toluene, xylene, and mesitylene; a nitrogen atom-containing solvent, such as dimethylformamide, dimethylacetamide, and N-methylpyrrolidone; and a sulfur atom-containing solvent, such as dimethylsulfoxide. One kind of the organic solvent may be used alone, or two or more kinds thereof may be used in combination. Among these, cyclohexanone, propylene glycol monomethyl ether, and methyl cellosolve are preferred from the standpoint of the solubility, cyclohexanone and propylene glycol monomethyl ether are more preferred from the standpoint of the low toxicity, and propylene glycol monomethyl ether is further preferred since the high volatility thereof prevents the solvent from remaining as a residual solvent in the production of a prepreg.

(Content of Component (a))

The content of the component (a) in the thermosetting resin composition of the embodiment 1 is not particularly limited, and is preferably 30 to 99 parts by mass, more preferably 35 to 90 parts by mass, further preferably 40 to 85 parts by mass, particularly preferably 45 to 80 parts by mass, and most preferably 55 to 80 parts by mass, per 100 parts by mass of the resin component in the thermosetting resin composition.

The content of the component (a) in the thermosetting resin composition of the embodiments 2 and 3 is not particularly limited, and is preferably 2 to 99 parts by mass, preferably 30 to 99 parts by mass, more preferably 35 to 90 parts by mass, further preferably 40 to 85 parts by mass, particularly preferably 45 to 80 parts by mass, and most preferably 55 to 80 parts by mass, per 100 parts by mass of the resin component in the thermosetting resin composition.

<Compound (b) represented by General Formula (1) Exhibiting no Reactivity with Maleimide Group of Component (a)>

The component (b) mixed with the component (a) can enhance the high frequency characteristics of the thermosetting resin composition as described above.

The component (b) is represented by the following general formula (1), and as a premise, exhibits no reactivity with the maleimide group of the component (a). Accordingly, the substituents that the groups in the general formula (1) can have are limited to substituents exhibiting no reactivity with the maleimide group of the component (a). The expression "exhibiting no reactivity" means that no reaction occurs at 200° C. or less.

Examples of the substituent that exhibits reactivity with the maleimide group of the component (a) include an amino group, an epoxy group (including a glycidyl group), and a maleimide group.

One kind of the component (b) may be used alone, or two or more kinds thereof may be used in combination.

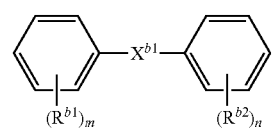

(1)

In the general formula (1), $X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5.

Examples of the aliphatic hydrocarbon group having 1 to 5 carbon atoms represented by $X^{b1}$ include an alkylene group having 1 to 5 carbon atoms, such as a methylene group, a dimethylene group, a trimethylene group, and a pentamethylene group; and an alkylidene group having 2 to 5 carbon atoms, such as an isopropylidene group. The aliphatic hydrocarbon group is preferably an aliphatic hydrocarbon group having 1 to 3 carbon atoms, and more preferably a methylene group or an isopropylidene group.

The aliphatic hydrocarbon group may have a substituent, or may be unsubstituted. The substituent is not particularly limited, as far as being a substituent that has no reactivity with the maleimide group of the component (a), and examples thereof include a halogen atom, a hydroxy group, a nitro group, and a cyano group (which may be hereinafter referred to as a "substituent A").

$X^{b1}$ preferably represents a single bond among the options described above from the standpoint of the high frequency characteristics.

Examples of the aliphatic hydrocarbon group having 1 to 10 carbon atoms represented by $R^{b1}$ and $R^{b2}$ include a methyl group, an ethyl group, a n-propyl group, an isopropyl group, a n-butyl group, an isobutyl group, a t-butyl group, a n-pentyl group, and a n-octyl group. Among these, an aliphatic hydrocarbon group having 1 to 5 carbon atoms is preferred, an aliphatic hydrocarbon group having 2 or 3 carbon atoms is more preferred, and an ethyl group is further preferred.

The aliphatic hydrocarbon group may have a substituent, or may be unsubstituted. Examples of the substituent include the substituent A.

Examples of the aromatic hydrocarbon group having 6 to 18 ring carbon atoms represented by $R^{b1}$ and $R^{b2}$ include a phenyl group, a naphthyl group, an anthryl group, and a biphenylyl group. The aromatic hydrocarbon group is preferably an aromatic hydrocarbon group having 6 to 12 carbon atoms, and more preferably a phenyl group or a biphenylyl group.

The aromatic hydrocarbon group may have a substituent, or may be unsubstituted. Examples of the substituent include the substituent A, and also include an aliphatic hydrocarbon group having 1 to 10 (preferably 1 to 5) carbon atoms.

Examples of the heterocyclic aromatic hydrocarbon group having 5 to 20 ring atoms represented by $R^{b1}$ and $R^{b2}$ include a triazinyl group, an oxazolinyl group, a pyridinyl group, and a thiophenyl group. The heterocyclic aromatic hydrocarbon group is preferably a heterocyclic aromatic hydrocarbon group having 5 to 12 ring atoms.

The heterocyclic aromatic hydrocarbon group may have a substituent, or may be unsubstituted. Examples of the substituent include the substituent A, and also include an aliphatic hydrocarbon group having 1 to 10 (preferably 1 to 5) carbon atoms.

Examples of the oxygen atom-containing group represented by $R^{b1}$ and $R^{b2}$ include —$OR^{b3}$ (wherein $R^{b3}$ represents a substituted or unsubstituted aliphatic hydrocarbon group having 1 to 10 carbon atoms or a substituted or unsubstituted aromatic hydrocarbon group having 6 to 18 ring carbon atoms), a keto group, and —O—(=O)(—$OR^{b4}$)(—$OR^{b5}$) (wherein $R^{b4}$ and $R^{b5}$ each independently represent a substituted or unsubstituted aliphatic hydrocarbon group having 1 to 10 carbon atoms or a substituted or unsubstituted aromatic hydrocarbon group having 6 to 18 ring carbon atoms. The oxygen atom-containing group is preferably a keto group or —O—P(=O)(—$OR^{b4}$)(—$OR^{b5}$).

Examples of the aliphatic hydrocarbon group having 1 to 20 carbon atoms represented by $R^{b3}$, $R^{b4}$, and $R^{b5}$ include a methyl group, an ethyl group, a n-propyl group, an isopropyl group, a n-butyl group, an isobutyl group, a t-butyl group, a n-pentyl group, and a n-octyl group. Among these, an aliphatic hydrocarbon group having 1 to 10 carbon atoms is preferred, and an aliphatic hydrocarbon group having 1 to 5 carbon atoms is more preferred. The aliphatic hydrocarbon group may have a substituent, or may be unsubstituted. Examples of the substituent include the substituent A.

Examples of the aromatic hydrocarbon group having 6 to 18 ring carbon atoms represented by $R^{b3}$, $R^{b4}$, and $R^{b5}$ include a phenyl group, a naphthyl group, an anthryl group, and a biphenylyl group. The aromatic hydrocarbon group is preferably an aromatic hydrocarbon group having 6 to 12 ring carbon atoms, and more preferably a phenyl group. The aromatic hydrocarbon group may have a substituent, or may be unsubstituted. Examples of the substituent include the substituent A, and also include an aliphatic hydrocarbon group having 1 to 10 carbon atoms (preferably 1 to 5 carbon atoms, more preferably 1 to 3 carbon atoms, and further preferably 1 carbon atom).

$R^{b1}$ and $R^{b2}$ each may represent a group including a combination of at least two kinds of groups selected from the group consisting of an aliphatic hydrocarbon group having 1 to 10 carbon atoms, an aromatic hydrocarbon group having 6 to 18 ring carbon atoms, a heterocyclic aromatic hydrocarbon group having 5 to 20 ring atoms, and an oxygen atom-containing group. Examples of the combination include "an aliphatic hydrocarbon group having 1 to 10 carbon atoms and an aromatic hydrocarbon group having 6 to 18 ring carbon atoms", "an aliphatic hydrocarbon group having 1 to 10 carbon atoms and a heterocyclic aromatic hydrocarbon group having 5 to 20 ring atoms", "an aromatic hydrocarbon group having 6 to 18 ring carbon atoms, an aliphatic hydrocarbon group having 1 to 10 carbon atoms, and an aromatic hydrocarbon group having 6 to 18 ring carbon atoms", "a heterocyclic aromatic hydrocarbon group having 5 to 20 ring atoms, an aliphatic hydrocarbon group having 1 to 10 carbon atoms, and an aromatic hydrocarbon group having 6 to 18 ring carbon atoms", "an aliphatic hydrocarbon group having 1 to 10 carbon atoms and an oxygen atom-containing group", "an aromatic hydrocarbon group having 6 to 18 ring carbon atoms and an oxygen atom-containing group", and "an oxygen atom-containing group and an aromatic hydrocarbon group having 6 to 18 ring carbon atoms". In each of the combinations, the group described first in the double quotation marks is bonded to the benzene ring shown in the general formula (1).

Among these, the combination is preferably "an aliphatic hydrocarbon group having 1 to 10 carbon atoms and an aromatic hydrocarbon group having 6 to 18 ring carbon atoms" or "an oxygen atom-containing group and an aromatic hydrocarbon group having 6 to 18 ring carbon atoms", preferably an aralkyl group, such as a benzyl group, or "a keto group and an aromatic hydrocarbon group having 6 to 18 ring carbon atoms", and more preferably a benzyl group or "a keto group and a phenyl group". The combination of "a keto group and a phenyl group" is a group represented by the following structural formula.

"keto group-phenyl group"

In the formula, * represents a bonding site bonded to another structure (which is specifically the benzene ring).

m and n each independently represent an integer of 0 to 5, preferably an integer of 0 to 3, and more preferably 0 or 1, may represent 0, and may represent 1. It is also preferred that m represents 0, and n represents 1, and it is also preferred that m represents 1, and n represents 1.

In the case where m represents an integer of 2 to 5, the multiple groups represented by $R^{b1}$ may be the same as or different from each other. In the case where n represents an integer of 2 to 5, the multiple groups represented by $R^{b2}$ may be the same as or different from each other.

Preferred embodiments of the general formula (1) include the following general formulae (1-1) and (1-2).

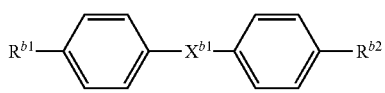

(1-1)

In the general formula (1-1), $X^{b1}$, $R^{b1}$, and $R^{b2}$ have the same meanings as in the general formula (1), and the preferred embodiments thereof are also the same.

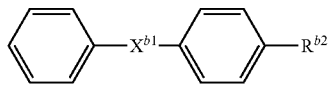

(1-2)

In the general formula (1-2), $X^{b1}$ and $R^{b2}$ have the same meanings as in the general formula (1), and the preferred embodiments thereof are also the same.

The component (b) is preferably a compound represented by the following general formula (1'). As a premise, this compound exhibits no reactivity with the maleimide group of the component (a).

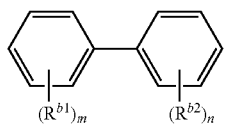

(1')

In the general formula (1'), $R^{b1}$, $R^{b2}$, m, and n have the same meanings as in the general formula (1), and the preferred embodiments thereof are also the same.

Preferred embodiments of the general formula (1') include the following general formulae (1'-1) and (1'-2).

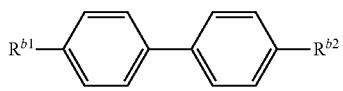

(1'-1)

In the general formula (1'-1), $R^{b1}$ and $R^{b2}$ have the same meanings as in the general formula (1'), and the preferred embodiments thereof are also the same.

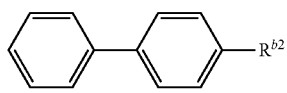

(1'-2)

In the general formula (1'-2), $R^{b2}$ has the same meaning as in the general formula (1'), and the preferred embodiments thereof are also the same.

The boiling point under one atmosphere (101.325 kPa) of the component (b) is preferably 260° C. or more, and more preferably 280° C. or more, and may be 300° C. or more, from the standpoint of the avoidance of voids occurring in a reflow process of a printed wiring board. The upper limit of the boiling point is not particularly limited, and the boiling point under one atmosphere (101.325 kPa) of the component (b) may be 500° C. or less, may be 450° C. or less, may be 400° C. or less, and may be 350° C. or less.

From this standpoint, the component (b) is preferably at least one kind selected from the group consisting of diethylbiphenyl and benzylbiphenyl, and more preferably at least one kind selected from the group consisting of 4,4'-diethylbiphenyl and 4-benzylbiphenyl.

(Content of Component (b))

The content of the component (b) is not particularly limited, is preferably 0.001 to 1.0 mol, more preferably 0.01 to 0.95 mol, further preferably 0.01 to 0.90 mol, and particularly preferably 0.05 to 0.90 mol, and in the embodiment 1, may be 0.15 to 0.90 mol, and may be 0.15 to 0.70 mol, all per 1 mol of the component (a). In the embodiments 2 and 3, the content of the component (b) may be 0.001 to 0.5 mol, may be 0.01 to 0.5 mol, may be 0.04 to 0.3 mol, and may be 0.04 to 0.2 mol, per 1 mol of the component (a). In the case where the content of the component (b) is the lower limit value or more, there is a tendency that the enhancing effect of the high frequency characteristics can be easily exhibited. The content of the component (b) may exceed the upper limit value, but is preferably the upper limit value or less from the standpoint of the production cost since there is a tendency that the enhancing effect of the high frequency characteristics is saturated.

<Inorganic Filler (c)>

The thermosetting resin composition of the present embodiment may further contain an inorganic filler (c) (which may be hereinafter referred to as a component (c)) from the standpoint of the low thermal expansion property.

While the component (c) is not particularly limited, examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay, talc, aluminum borate, silicon carbide, quartz powder, glass short fibers, glass fine powder, and hollow glass, and at least one kind selected from the group consisting of these is preferably used. Preferred examples of the glass include E-glass, T-glass, and D-glass. One kind of the component (c) may be used alone, or two or more kinds thereof may be used in combination.

Among these, silica is preferred from the standpoint of the dielectric characteristics, the heat resistance, and the low thermal expansion property. Examples of the silica include precipitated silica having a high water content produced by a wet method and a dry method silica containing substantially no combined water produced by a dry method. The dry method silica is classified into crushed silica, fumed silica, fused spherical silica, and the like, depending on the difference in production method. Among these, fused spherical silica is preferred from the standpoint of the low thermal expansion property and the fluidity thereof in adding to the resin.

The component (c) may be surface-treated with a coupling agent. The method of the surface treatment with a coupling agent may be a method of surface-treating the inorganic filler before mixing, by a dry method or a wet method, and may be a so-called integral blend treatment in which the surface-untreated inorganic filler is mixed with other components to form a composition, and then the coupling agent is added to the composition.

Examples of the coupling agent include a silane-based coupling agent, a titanate-based coupling agent, and a silicone oligomer. Among these, a silane-based coupling agent is preferred. Examples of the silane-based coupling agent include an epoxysilane-based coupling agent, an aminosilane-based coupling agent, a vinylsilane-based coupling agent, a phenylsilane-based coupling agent, an alkylsilane-based coupling agent, an alkenylsilane-based coupling agent, an alkynylsilane-based coupling agent, a haloalkylsilane-based coupling agent, a siloxane-based coupling agent, a hydrosilane-based coupling agent, a silazane-based coupling agent, an alkoxysilane-based coupling agent, a chlorosilane-based coupling agent, a (meth)acrylsilane-based coupling agent, an isocyanuratesilane-based coupling agent, a ureidosilane-based coupling agent, a mercaptosilane-based coupling agent, a sulfidesilane-based coupling agent, and an isocyanatesilane-based coupling agent. Among these, an aminosilane-based coupling agent is more preferred.

The average particle diameter of the inorganic filler (c) is not particularly limited, is preferably 0.01 to 30 μm, more preferably 0.05 to 20 μm, further preferably 0.1 to 10 μm, and particularly preferably 0.2 to 5 μm, may be 0.2 to 2 μm, and may be 0.1 to 1 μm.

In the case where the average particle diameter of the inorganic filler (c) is the lower limit value or more, there is a tendency that the improved fluidity can be easily retained in highly filling the inorganic filler (c) in the thermosetting resin composition, and in the case where the average particle diameter of the inorganic filler (c) is the upper limit value or less, there is a tendency that the surface roughness of the insulating layer can be suppressed from being increased.

The "average particle diameter" in the description herein means the particle diameter at the point corresponding to 50% in volume on the cumulative frequency distribution curve of the particle diameter assuming that the total volume of the particles is 100% (i.e., the volume average particle diameter), and is measured with a particle size distribution measuring equipment using the laser diffraction scattering method.

(Content of Component (c))

In the case where the thermosetting resin composition of the present embodiment contains the component (c), the content thereof is not particularly limited, is preferably 5 to 65% by volume, more preferably 10 to 60% by volume, further preferably 15 to 60% by volume, and particularly preferably 20 to 55% by volume, may be 20 to 50% by volume, may be 20 to 40% by volume, and may be 25 to 40% by volume, all based on the solid content in the thermosetting resin composition.

In the case where the content of the component (c) is the lower limit value or more, there is a tendency that the low thermal expansion property is improved, and in the case where the content thereof is the upper limit value or less, there is a tendency that the prepreg can be easily prevented from suffering blur.

<Thermosetting Resin (d)>

The thermosetting resin composition of the present embodiment may further contain a thermosetting resin (d) (which may be hereinafter referred to as a component (d)). The component (d) contained in the thermosetting resin composition of the present embodiment can particularly enhance the adhesiveness to a metal foil, such as a copper foil. However, the thermosetting resin composition of the present embodiment may not contain the thermosetting resin (d).

The component (d) does not include the component (a) described above.

Examples of the component (d) include an epoxy resin, a phenol resin, an unsaturated imide resin (provided that the component (a) is excluded), a cyanate resin, an isocyanate resin, a benzoxazine resin, an oxetane resin, an amino resin, an unsubstituted polyester resin, an allyl resin, a dicyclopentadiene resin, a silicone resin, a triazine resin, and a melamine resin, and at least one kind selected from the group consisting of these is preferably used. Among these, an epoxy resin is preferred from the standpoint of the moldability and the electric insulating capability and the standpoint of the enhancement of the adhesiveness to a metal foil.

As the thermosetting resin (d), a thermosetting resin having an ICI viscosity at 150° C. of preferably 1.0 Pa·s or less, more preferably 0.5 Pa·s or less, further preferably 0.3 Pa·s or less, and particularly preferably 0.2 Pa·s or less, may be selected from the standpoint of the moldability. The ICI viscosity herein is to measure a high-speed shearing rate, which is known as an ICI viscometer, and is a viscosity measured with a cone-plate type viscometer.

(Content of Component (d))

In the case where the thermosetting resin composition of the present embodiment contains the thermosetting resin (d), the content thereof is preferably 5 to 50 parts by mass, more preferably 10 to 40 parts by mass, and further preferably 15 to 40 parts by mass, per 100 parts by mass of the thermosetting resin composition, from the standpoint of the heat resistance, the low thermal expansion property, and the adhesiveness to a metal foil.

<Curing Accelerator (e)>

The thermosetting resin composition of the present embodiment may further contain a curing accelerator (e) (which may be hereinafter referred to as a component (e)). The component (e) contained in the thermosetting resin composition can further enhance the heat resistance, the flame retardancy, and the adhesiveness to a metal foil.

Examples of the component (e) include an imidazole-based compound and a derivative thereof; an organic phosphorus-based compound, such as a phosphine compound, a phosphonium salt, and an adduct of a tertiary phosphine and a quinone compound; a secondary amine, a tertiary amine, and a quaternary ammonium salt. One kind of the component (e) may be used alone, or two or more kinds thereof may be used in combination.

(Content of Component (e))

In the case where the thermosetting resin composition contains the component (e), the content thereof is preferably 0.1 to 10 parts by mass, more preferably 0.1 to 5 parts by mass, and further preferably 0.1 to 2 parts by mass, per 100 parts by mass of the resin component. In the case where the content thereof is 0.1 part by mass or more, there is a tendency that the excellent heat resistance, flame retardancy, and adhesiveness to a metal foil can be obtained, and in the case where the content thereof is 10 parts by mass or less, there is a tendency that the heat resistance, the temporal stability, and the press moldability are not easily deteriorated.

<Monoamine Compound (f)>

The thermosetting resin composition of the present embodiment may further contain, or may not contain, a monoamine compound (f) (which may be hereinafter referred to as a component (f)). The component (f) contained in the thermosetting resin composition of the present embodiment can further enhance the heat resistance and the low thermal expansion property.

The component (f) used may be the same as the monoamine compound (a2) described above, and the preferred embodiments thereof are also the same.

(Content of Component (f))

In the case where the thermosetting resin composition of the present embodiment contains the component (f), the content thereof is preferably 0.1 to 10 parts by mass, and more preferably 0.2 to 5 parts by mass, per 100 parts by mass of the resin component of the thermosetting resin composition, from the standpoint of the reduction of the thermal expansion coefficient while retaining the heat resistance.

<Amine Compound (g) Having at Least Two Amino Groups>

The thermosetting resin composition of the present embodiment may further contain, or may not contain, an amine compound (g) having at least two amino groups (which may be hereinafter referred to as a component (g)). The component (g) contained in the thermosetting resin composition of the present embodiment can further enhance the heat resistance and the low thermal expansion property.

The amino groups are preferably primary amino groups.

The component (g) used may be the same as the amine compound (a3) having at least two amino groups described above, and the preferred embodiments thereof are also the same.

(Content of Component (g))

In the case where the thermosetting resin composition of the present embodiment contains the component (g), the content thereof is preferably 0.1 to 20 parts by mass, and more preferably 1 to 10 parts by mass, per 100 parts by mass of the resin component of the thermosetting resin composition, from the standpoint of the reduction of the thermal expansion coefficient while retaining the heat resistance.

<Silicone Compound (g') Having at Least Two Amino Groups>

The thermosetting resin composition of the embodiment 3 is thermosetting resin composition that further contain a silicone compound (g') having at least two amino groups. As far as the thermosetting resin composition of the present embodiment contains the component (g'), the component (g) is defined as not containing the component (g').

The component (g') used may be the same as the silicone compound (a3') having at least two amino groups described above, and the preferred embodiments thereof are also the same.

(Content of Component (g'))

In the case where the thermosetting resin composition of the present embodiment contains the component (g'), the content thereof is preferably 0.1 to 20 parts by mass, and more preferably 1 to 10 parts by mass, per 100 parts by mass of the resin component of the thermosetting resin composition, from the standpoint of the reduction of the thermal expansion coefficient while retaining the heat resistance.

<Additional Components>

The thermosetting resin composition of the present embodiment may optionally contain a thermoplastic resin, an organic filler, a flame retardant, a flame retardant aid, an ultraviolet ray absorbent, a peroxide, an antioxidant, a photopolymerization initiator, a fluorescent brightener, an adhesiveness improver, and the like known in the art, in such an extent that does not impair the thermosetting property thereof.

Examples of the thermoplastic resin include polyethylene, polypropylene, polystyrene, a polyphenylene ether resin, a phenoxy resin, a polycarbonate resin, a polyester resin, a polyamide resin, a polyamideimide resin, a polyimide resin, a xylene resin, a polyphenylene sulfide resin, a polyetherimide resin, a polyether ether ketone resin, a silicone resin, and a tetrafluoroethylene resin.

Examples of the organic filler include a resin filler and a resin filler having a core-shell structure of polyethylene, polypropylene, polystyrene, a polyphenylene ether resin, a silicone resin, and a tetrafluoroethylene resin.

Examples of the flame retardant include a phosphorus-based flame retardant, such as an aromatic phosphate ester compound, a phosphazene compound, a phosphinate ester, a metal salt of a phosphinic acid, red phosphorus, and 9,10-dihydro-9-oxa-10-phosphaphenanthrene 10-oxide and a derivative thereof; a nitrogen-based flame retardant, such as guanidine sulfamate, melamine sulfate, melamine polyphosphate, and melamine cyanurate; and a halogen-containing flame retardant containing bromine, chlorine, or the like.

Examples of the flame retardant aid include an inorganic flame retardant, such as antimony trioxide, sodium antimonate, zinc sulfide, zinc borate, zinc stannate, and zinc molybdate. These may be supported on a carrier, such as talc.

Substances functioning as the flame retardant and substances functioning as the flame retardant aid are not classified into the inorganic filler (c), but are classified into the flame retardant or the flame retardant aid, even through the substances are inorganic compounds.

Examples of the ultraviolet ray absorbent include a benzotriazole-based ultraviolet ray absorbent.

Examples of the peroxide include an organic peroxide, such as $\alpha,\alpha'$-di(t-butylperoxy)diisopropylbenzene.

Examples of the antioxidant include a hindered phenol-based antioxidant and a hindered amine-based antioxidant.

Examples of the photopolymerization initiator include a benzophenone-based photopolymerization initiator, a benzylketal-based photopolymerization initiator, and a thioxanthone-based photopolymerization initiator.

Examples of the fluorescent brightener include a fluorescent brightener of a stilbene derivative.

Examples of the adhesiveness improver include a urea compound, such as urea silane, and the coupling agents described above.

(Varnish)

The thermosetting resin composition of the present embodiment may be in the form of a varnish containing the components dissolved or dispersed in an organic solvent for the use of the production of a prepreg and the like. Accordingly, the varnish is also encompassed in the thermosetting resin composition of the present embodiment.

Examples of the organic solvent used in the varnish include an alcohol-based solvent, such as methanol, ethanol, propanol, butanol, methyl cellosolve, butyl cellosolve, and propylene glycol monomethyl ether; a ketone-based solvent, such as acetone, methyl ethyl ketone, methyl isobutyl ketone, and cyclohexanone; an ester-based solvent, such as butyl acetate and propylene glycol monomethyl ether acetate; an ether-based solvent, such as tetrahydrofuran; an aromatic-based solvent, such as toluene, xylene, and mesitylene; a nitrogen atom-containing solvent, such as dimethylformamide, dimethylacetamide, and N-methylpyrrolidone; and a sulfur atom-containing solvent, such as dimethylsulfoxide. One kind of the organic solvent may be used alone, or two or more kinds thereof may be used in combination.

Among these, methyl ethyl ketone, methyl isobutyl ketone, cyclohexanone, methyl cellosolve, and propylene glycol monomethyl ether are preferred from the standpoint of the solubility, and methyl isobutyl ketone, cyclohexanone, and propylene glycol monomethyl ether are more preferred from the standpoint of the low toxicity.

The solid content concentration of the varnish is preferably 40 to 90% by mass, and more preferably 50 to 80% by mass. In the case where the solid content concentration of the varnish is in the range, the coatability can be favorably retained, and a prepreg having a suitable resin composition attached amount can be obtained.

[Prepreg]

The prepreg of the present embodiment contains a semi-cured material of the thermosetting resin composition of the present embodiment.

The prepreg of the present embodiment can be produced, for example, in such a manner that a fibrous substrate is impregnated with the thermosetting resin composition of the present embodiment, which is then subjected to conversion into B-stage through heating or the like. In the description herein, the conversion into B-stage means that the composition is converted into the B-stage, which is defined in JIS K6900(1994), and may also referred to as semi-curing. Accordingly, the semi-cured material of the thermosetting resin composition is a material obtained by subjecting the thermosetting resin composition to the conversion into B-stage.

The fibrous substrate used may be known ones that have been used various laminates for electric insulating materials. Examples of the material therefor include inorganic fibers, such as E-glass, S-glass, low dielectric glass, and Q-glass; organic fibers, such as a low dielectric glassy polyimide, a polyester, and tetrafluoroethylene; and mixtures thereof. Low dielectric glass and Q-glass are preferred from the standpoint of the achievement of the substrate excellent in dielectric characteristics.

The fibrous substrate may have such forms as a woven fabric, a nonwoven fabric, a roving, a chopped strand mat, and a surfacing mat. The material and the form of the fibrous substrate are appropriately selected depending on the application, the capability, and the like of the target molded article, in which a single material having a single form may be used, and two or more kinds of materials having two or more kinds of forms may be used in combination. The fibrous substrate used may have a thickness, for example, of approximately 0.01 to 0.5 mm. The fibrous substrate is preferably subjected to a surface treatment with a silane-based coupling agent or the like or to a mechanical opening treatment in view of the heat resistance, the moisture resistance, the workability, and the like.

The prepreg of the present embodiment is formed, for example, by impregnating the fibrous substrate with the thermosetting resin composition, so as to target an attached amount of the thermosetting resin composition with respect to the fibrous substrate (i.e., a solid amount of the thermosetting resin composition in the prepreg) of preferably 20 to 90% by mass. Thereafter, the prepreg can be obtained by subjecting to the conversion to B-stage by heating and drying at a temperature of 100 to 200° C. for 1 to 30 minutes.

The thickness of the prepreg of the present embodiment is not particularly limited, may be 10 to 300 µm, may be 10 to 200 µm, and may be 10 to 70 µm. The thickness herein is the thickness of the prepreg after heating and drying.

[Laminate and Metal-Clad Laminate]

The laminate of the present embodiment is a laminate containing a cured material of the prepreg of the present embodiment.

The laminate of the present embodiment can be obtained by laminating and molding the prepreg of the present embodiment. Specifically, one ply of the prepreg of the present embodiment is prepared, or 2 to 20 plies of the prepregs are prepared, and a metal foil, such as copper or aluminum, is disposed on one surface or both surfaces thereof to form a structure, which is then laminated and molded, resulting in the laminate. According to the production method, the laminate including an insulating layer formed with the prepreg of the present embodiment (the insulating layer has been subjected to conversion into C-stage), and a metal foil disposed on one surface or both surfaces thereof can be obtained. The metal foil is not particularly limited, as far as being one that is applied to electric insulating materials. The laminate including the laminate of the present embodiment having a metal foil disposed on one surface or both surfaces thereof is particularly referred to as a metal-clad laminate. In the description herein, the conversion into C-stage means that the prepreg is converted into the C-stage, which is defined in JIS K6900 (1994).

The molding condition in producing the laminate and the metal-clad laminate may be, for example, the method for a laminate and a multilayer board for electric insulating materials, and the laminates can be molded by using a multiplaten press, a multiplaten vacuum press, a continuous molding machine, an autoclave molding machine, or the like, at a temperature of 100 to 300° C., a pressure of 0.2 to 10 MPa, for a heating time of 0.1 to 5 hours. The laminate can also be produced by combining the prepreg of the present embodiment with a wiring board for an inner layer, and laminating and molding them.

[Printed Wiring Board]

The printed wiring board of the present embodiment is a printed wiring board including the laminate or the metal-clad laminate of the present embodiment, having a circuit formed thereon.

Examples of the method of forming a circuit include known methods, such as a subtractive process, a full additive process, a semi-additive process (SAP), and a modified semi-additive process (m-SAP).

For example, multiple assemblies each including the laminate having a circuit formed thereon held between the prepregs of the present embodiment may be laminated and pressed under heating to form a multilayer structure. Thereafter, through holes and blind holes are formed through drilling or laser machining, and interlayer wiring is formed through plating or with a conductive paste, so that a multilayer printed wiring board can be produced.

[High-Speed Communication Compatible Module]

The present disclosure also provides a high-speed communication compatible module including the printed wiring board of the present embodiment. The high-speed communication compatible module of the present embodiment is favorably used particularly in applications using signals in a high frequency band with a high communication traffic volume and a high communication speed, such as a wireless communication equipment, a network infrastructure equipment.

EXAMPLES

The present embodiment will be described in more detail with reference to examples below, but the examples do not limit the present disclosure.

The copper-attached resin plates obtained in the examples were evaluated for the characteristics in the following manner.

(1) Evaluation Method of High Frequency Characteristics

The copper-attached resin boards obtained in the examples each were immersed in a 10% by mass solution of ammonium persulfate (available from Mitsubishi Gas Chemical Co., Inc.) as a copper etching solution to remove the copper foil, resulting in a specimen, and a resin specimen for evaluation of 2 mm×50 mm was obtained from the specimen.

The relative permeability (Dk) and the dielectric tangent (Df) in a 10 GHz band of the resin specimen for evaluation were calculated from the resonance frequency and the no-load Q-value obtained by the cavity resonator method. A vector type network analyzer E8364B, available from Agilent Technologies, Inc., and CP531 (10 GHz resonator) and CPMA-V2 (program), all available from Kanto Electronic Application and Development Co., Ltd., were used as the measuring devices, and the measurement was performed at an atmospheric temperature of 25° C.

Smaller values of Dk and Df mean better high frequency characteristics.

(Evaluation Method of High Frequency Characteristics after Hygroscopic Test)

A hygroscopic test was performed by allowing the resin specimen for evaluation produced in "(1) Evaluation Method of High Frequency Characteristics" to stand in a thermostat chamber at 85° C. and a relative humidity of 85% for 48 hours.

Thereafter, the resin specimen for evaluation after the hygroscopic test was measured for Dk and Df according to the description in "(1) Evaluation Method of High Frequency Characteristics".

(2) Measurement Method of Thermal Expansion Coefficient

The specimen, from which the copper foil had been removed in "(1) Evaluation Method of High Frequency Characteristics", was cut out into an evaluation substrate of 5 mm in length×5 mm in width, which was then subjected to thermomechanical analysis by the compression method with a TMA test device (TMA 2940, trade name, available from TA Instruments Inc.)

The evaluation board was mounted standing upright on the device, and then measured twice continuously under measurement condition of a load of 5 g and a heating rate of 10° C./min. The average thermal expansion coefficient (i.e., the average of the linear thermal expansion coefficients in the longitudinal direction) from 30° C. to 100° C. in the second measurement was calculated and designated as the value of the thermal expansion coefficient.

(3) Measurement Method of Moisture Absorption Rate

The moisture absorption rate was calculated from the weight of the resin specimen for evaluation after the hygroscopic test in "(1) Evaluation Method of High Frequency Characteristics" according to the following calculation expression.

Moisture absorption rate=(((weight of resin specimen for evaluation after hygroscopic test)−(weight of resin specimen for evaluation before hygroscopic test))/(weight of resin specimen for evaluation before hygroscopic test))×100

(4) Measurement Method of Storage Elastic Modulus

A test piece having a width of 5 mm and a length of 30 mm was cut out from the specimen, from which the copper foil had been removed in "(1) Evaluation Method of High Frequency Characteristics", and measured for the storage elastic modulus (E') with a wide-range dynamic viscoelasticity measurement device (DVE-V4, trade name, available from Rheology Co., Ltd.). The measurement was performed in a measurement temperature range of 40 to 300° C., a heating rate of 5° C./min, and a vibration frequency of 10 Hz, and a storage elastic modulus (E') at 40° C. was obtained and designated as an index of the low warpage property.

A smaller storage elastic modulus means better low warpage property.

Examples A1 to A14

The components described in Table 1 were mixed in the mixing amounts described therein, and then pulverized and agitated in a mortar for 10 minutes, so as to produce resin powder.

A Teflon (registered trade name) plate (thickness: 1 mm), a part of which had been hollowed out, was placed on a copper foil, and the resin powder was charged in the hollowed part of the Teflon plate, and then heated to 240° C. at a heating rate of 4.0° C./min under a pressure of 3.0 MPa, followed by retaining for 85 minutes, so as to convert the resin powder to C-stage. After releasing the pressure, the assembly was cooled for 30 minutes to produce a copper-attached resin plate. The resulting copper-attached resin plate was evaluated for the high frequency characteristics. The results are shown in Table 1.

Comparative Example A1

A copper-attached resin plate was produced in the same manner as in Example A1 except that 4,4'-diethylbiphenyl was not mixed, and evaluated for the high frequency characteristics. The results are shown in Table 1.

Comparative Example A2

A copper-attached resin plate was produced in the same manner as in Comparative Example A1 except that an epoxy resin "NC3000-H" (available from Nippon Kayaku Co., Ltd.) and a phenol resin "TD-2093" (available from DIC Corporation) were used instead of the component (a), 2-ethyl-4-methylimidazole was used instead of α,α-bis(t-butylperoxy-m-isopropyl)benzene, 4,4'-(1,3-phenylenediisopropylidene)bisaniline was not used, and the mixing amounts of the components were changed as shown in Table 1, and evaluated for the high frequency characteristics. The results are shown in Table 1.

Comparative Example A3

A copper-attached resin plate was produced in the same manner as in Comparative Example A2 except that 4,4'-diethylbiphenyl was blended in the mixing amount shown in Table 1, and evaluated for the high frequency characteristics. The results are shown in Table 1.

TABLE 1

| | | | Example A | | | | | |
|---|---|---|---|---|---|---|---|---|
| | | | 1 | 2 | 3 | 4 | 5 | 6 |
| Thermo-setting resin composition | (a) | 2,2-bis [4-(4-Maleimidophenoxy)-phenyl]propane | 100 | 100 | 100 | 100 | 100 | 100 |
| | Substitute component | Epoxy resin | | | | | | |
| | | Phenol resin | | | | | | |

TABLE 1-continued

|  |  |  | | | | | | |
|---|---|---|---|---|---|---|---|---|
|  | (b) | 4,4'-Diethylbiphenyl 4-Benzylbiphenyl | (0.025) | (0.05) | (0.10) | (0.20) | (0.30) | (0.60) |
|  | (g) | 4,4'-(1,3-Phenylenediisopropylidene)-bisaniline | 20 | 20 | 20 | 20 | 20 | 20 |
|  | (Additional component) | α,α-bis(t-Butylperoxy-m-isopropyl)benzene 2-Ethyl-4-methylimidazole | 0.3 | 0.3 | 0.3 | 0.3 | 0.3 | 0.3 |
| Evaluation results | (1) High frequency characteristics (10 GHz) | Relative permeability (Dk) | 2.74 | 2.72 | 2.70 | 2.70 | 2.69 | 2.69 |
|  |  | Dielectric tangent (Df) | 0.0038 | 0.0034 | 0.0029 | 0.0027 | 0.0025 | 0.0024 |

|  |  |  | Example A | | | | | |
|---|---|---|---|---|---|---|---|---|
|  |  |  | 7 | 8 | 9 | 10 | 11 | 12 |
| Thermosetting resin composition | (a) | 2,2-bis [4-(4-Maleimidophenoxy)-phenyl]propane | 100 | 100 | 100 | 100 | 100 | 100 |
|  | Substitute component | Epoxy resin Phenol resin |  |  |  |  |  |  |
|  | (b) | 4,4'-Diethylbiphenyl 4-Benzylbiphenyl | (0.90) | (0.025) | (0.05) | (0.10) | (0.20) | (0.30) |
|  | (g) | 4,4'-(1,3-Phenylenediisopropylidene)-bisaniline | 20 | 20 | 20 | 20 | 20 | 20 |
|  | (Additional component) | α,α-bis(t-Butylperoxy-m-isopropyl)benzene 2-Ethyl-4-methylimidazole | 0.3 | 0.3 | 0.3 | 0.3 | 0.3 | 0.3 |
| Evaluation results | (1) High frequency characteristics (10 GHz) | Relative permeability (Dk) | 2.70 | 2.73 | 2.74 | 2.74 | 2.73 | 2.73 |
|  |  | Dielectric tangent (Df) | 0.0024 | 0.0034 | 0.0032 | 0.0028 | 0.0031 | |0.0029 |

|  |  |  | Example A | | Comparative Example A | | |
|---|---|---|---|---|---|---|---|
|  |  |  | 13 | 14 | 1 | 2 | 3 |
| Thermosetting resin composition | (a) | 2,2-bis [4-(4-Maleimidophenoxy)-phenyl]propane | 100 | 100 | 100 |  |  |
|  | Substitute component | Epoxy resin |  |  |  | 100 | 100 |
|  |  | Phenol resin |  |  |  | 36 | 36 |
|  | (b) | 4,4'-Diethylbiphenyl 4-Benzylbiphenyl | (0.60) | (0.90) | — | — | (0.3) |
|  | (g) | 4,4'-(1,3-Phenylenediisopropylidene)-bisaniline | 20 | 20 | 20 | — | — |
|  | (Additional component) | α,α-bis(t-Butylperoxy-m-isopropyl)benzene | 0.3 | 0.3 | 0.3 |  |  |
|  |  | 2-Ethyl-4-methylimidazole |  |  |  | 0.3 | 0.3 |
| Evaluation results | (1) High frequency characteristics (10 GHz) | Relative permeability (Dk) | 2.71 | 2.72 | 2.79 | 3.11 | 3.09 |
|  |  | Dielectric tangent (Df) | 0.0030 | 0.0029 | 0.0046 | 0.0130 | 0.0128 |

The unit of the mixing amounts is part by mass except for the component (b) (provided that the solution and the dispersion are shown in terms of solid content).
The mixing amount of the component (b) is shown in the parentheses in terms of molar number per 1 mol of the component (a).

The components shown in Table 1 are shown below.
[Component (a)]
  2,2-bis[4-(4-Maleimidophenoxy)-phenyl]propane  (see the structural formula below)

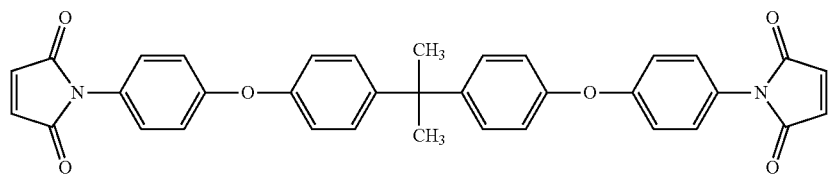

2,2-bis[4-(4-maleimidophenoxy)-phenyl]propane
[Substitute Substance of Component (a)]
    Epoxy resin: NC3000-H (available from Nippon Kayaku Co., Ltd.)
    Phenol resin (epoxy curing agent): TD-2093 (available from DIC Corporation)
[Component (b)]
    4,4'-Diethylbiphenyl (see the structural formula below), boiling point: 315° C. (1 atm)

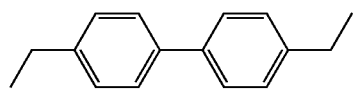

4,4'-diethylbiphenyl

4-Benzylbiphenyl (see the structural formula below), boiling point: 286° C. (14 kPa)

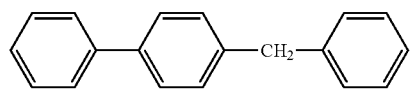

4-benzylbiphenyl
[Component (g)]
    4,4'-(1,3-Phenylenediisopropylidene)-bisaniline (see the structural formula below)

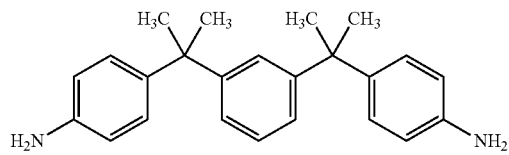

4,4'-(1,3-phenylenediisopropylidene)-bisaniline

[Additional Component, Peroxide]

α,α-bis(t-Butylperoxy-m-isopropyl)benzene (see the structural formula below)

2-Ethyl-4-methylimidazole

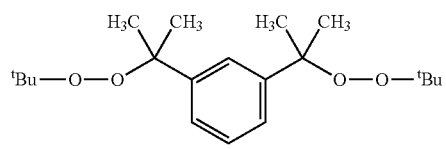

α,α-bis(t-butylperoxy-m-isopropyl)benzene

It is understood from the comparison between Examples A1 to A14 and Comparative Example A1 in Table 1 that in the case where 4,4'-diethylbiphenyl or 4-benzylbiphenyl is mixed in 2,2-bis[4-(4-maleimidophenoxy)-phenyl]propane, the high frequency characteristics are enhanced.

On the other hand, it is understood from the comparison between Comparative Example A2 and Comparative Example A3 that in the case where 4,4'-diethylbiphenyl is mixed in the epoxy resin (and the phenol resin), the enhancing effect of the high frequency characteristics is poor.

Examples A15 to A17 and Comparative Examples A4 to A7

Copper-attached resin plates were produced by performing the same procedures as in Example A1 except that the kind and the mixing amount of the component (b) were changed as shown in Table 2. The resulting copper-attached resin plates were evaluated for the high frequency characteristics. The results are shown in Table 2.

TABLE 2

| | | | Example A | | | Comparative Example A | | | |
| --- | --- | --- | --- | --- | --- | --- | --- | --- | --- |
| | | | 15 | 16 | 17 | 4 | 5 | 6 | 7 |
| Thermo-setting resin composition | (a) | 2,2-bis[4-(4-Maleimidophen-oxy)phenyl]propane | 100 | 100 | 100 | 100 | 100 | 100 | 100 |
| | (b) | 4-Phenylbenzophenone | (0.10) | (0.20) | (0.30) | — | — | — | — |
| | | Di-p-tolyl ether | — | — | — | — | (0.10) | (0.20) | (0.30) |
| | (g) | 4,4'-(1,3-Phenylenediisopropylidene)-bisaniline | 20 | 20 | 20 | 20 | 20 | 20 | 20 |
| | (Additional component) | α,α-bis(t-Butylperoxy-m-isopropyl)benzene | 0.3 | 0.3 | 0.3 | 0.3 | 0.3 | 0.3 | 0.3 |
| Evaluation results | (1) High frequency characteristics (10 GHz) | Relative permeability (Dk) | 2.78 | 2.78 | 2.78 | 2.82 | 2.82 | 2.82 | 2.80 |
| | | Dielectric tangent (Df) | 0.0033 | 0.0033 | 0.0031 | 0.0038 | 0.0042 | 0.0043 | 0.0042 |

The unit of the mixing amounts is part by mass except for the component (b) (provided that the solution and the dispersion are shown in terms of solid content).
The mixing amount of the component (b) is shown in the parentheses in terms of molar number per 1 mol of the component (a).

The components (b) shown in Table 2 are shown below, and the other components are the same as in Table 1.

[Component (b)]

4-Phenylbenzophenone (see the structural formula below), boiling point: 420° C. (1 atm)

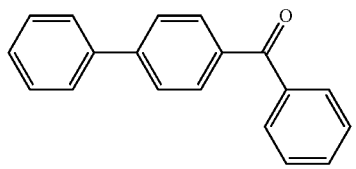

4-phenylbenzophenone

Di-p-tolyl ether (see the structural formula below), boiling point: 285° C. (1 atm)

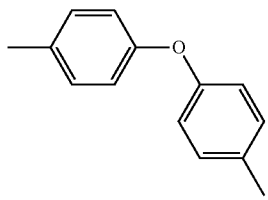

di-p-tolyl ether

It is understood from the comparison between Examples A15 to A17 and Comparative Example A4 in Table 2 that in the case where 4-phenylbenzophenone is mixed in 2,2-bis [4-(4-maleimidophenoxy)-phenyl]propane, the high frequency characteristics are enhanced.

On the other hand, it is understood from the comparison between Examples A15 to A17 and Comparative Examples A5 to A7 that in the case where 4-phenylbenzophenone is changed to di-p-tolyl ether, substantially no enhancing effect of the high frequency characteristics is obtained, and the dielectric tangent is rather deteriorated.

Examples A18 to A25 and Comparative Examples A8 and A9

Copper-attached resin plates were produced by performing the same procedures as in Example A1 except that the kinds and the mixing amounts of the components were changed as shown in Table 3. The resulting copper-attached resin plates were evaluated for the high frequency characteristics, the high frequency characteristics after the hygroscopic test, and the moisture absorption rate. The results are shown in Table 3.

TABLE 3

| | | | Example A | | | | | |
|---|---|---|---|---|---|---|---|---|
| | | | 18 | 19 | 20 | 21 | 22 | 23 |
| Thermo-setting resin composition | (a) | 2,2-bis [4-(4-Maleimidophenoxy)-phenyl]propane | 100 | 100 | 100 | 100 | | |
| | | Biphenyl aralkyl type maleimide | | | | | 100 | 100 |
| | (b) | 4,4'-Diethylbiphenyl | | (0.6) | | (0.6) | (0.6) | |
| | | Biphenyl skeleton-containing compound 1 | (0.6) | | (1.2) | | | (0.6) |
| | (g) | 4,4'-(1,3-Phenylenediisopropylidene)-bisaniline | 24 | 48 | 24 | 24 | 24 | 24 |
| | (Additional component) | α,α-bis(t-Butylperoxy-m-isopropyl)benzene | 1.3 | 1.5 | 1.3 | 1.3 | 1.3 | 1.3 |
| Evaluation results | (1) High frequency characteristics (10 GHz) | Relative permeability (Dk) | 2.75 | 2.67 | 2.68 | 2.71 | 2.77 | 2.74 |
| | | Dielectric tangent (Df) | 0.0021 | 0.0027 | 0.0016 | 0.0026 | 0.0021 | 0.0019 |
| | | Relative permeability (Dk) after hygroscopic test | 2.86 | 2.76 | 2.75 | 2.83 | 2.86 | 2.84 |
| | | Change amount of Dk before and after hygroscopic test | 0.11 | 0.09 | 0.07 | 0.11 | 0.09 | 0.10 |
| | | Dielectric tangent (Df) after hygroscopic test | 0.0070 | 0.0073 | 0.0051 | 0.0070 | 0.0058 | 0.0062 |
| | | Change amount of Df before and after hygroscopic test | 0.0049 | 0.0045 | 0.0035 | 0.0044 | 0.0037 | 0.0043 |
| | (3) Moisture absorption rate (%) (85° C./85% RH, 48 hours) | | 0.74 | 0.70 | 0.57 | 0.65 | 0.58 | 0.69 |

TABLE 3-continued

|  |  |  | Example A | | Comparative Example A | |
|---|---|---|---|---|---|---|
|  |  |  | 24 | 25 | 8 | 9 |
| Thermo-setting resin composition | (a) | 2,2-bis [4-(4-Maleimidophenoxy)-phenyl]propane | 41 | 100 | 100 |  |
|  |  | Biphenyl aralkyl type maleimide | 59 |  |  | 100 |
|  | (b) | 4,4'-Diethylbiphenyl |  | (0.2) |  |  |
|  |  | Biphenyl skeleton-containing compound 1 | (0.6) |  |  |  |
|  | (g) | 4,4'-(1,3-Phenylenediisopropylidene)-bisaniline | 24 | 24 | 24 | 24 |
|  | (Additional component) | α,α-bis(t-Butylperoxy-m-isopropyl)benzene | 1.3 | 1.3 | 1.3 | 1.3 |
| Evaluation results | (1) High frequency characteristics (10 GHz) | Relative permeability (Dk) | 2.74 | 2.82 | 2.85 | 2.83 |
|  |  | Dielectric tangent (Df) | 0.0017 | 0.0035 | 0.0043 | 0.0041 |
|  |  | Relative permeability (Dk) after hygroscopic test | 2.82 | 3.00 | 3.18 | 3.13 |
|  |  | Change amount of Dk before and after hygroscopic test | 0.07 | 0.19 | 0.33 | 0.29 |
|  |  | Dielectric tangent (Df) after hygroscopic test | 0.0054 | 0.0099 | 0.0147 | 0.0141 |
|  |  | Change amount of Df before and after hygroscopic test | 0.0036 | 0.0063 | 0.0104 | 0.0099 |
|  | (3) Moisture absorption rate (%) (85° C./85% RH, 48 hours) |  | 0.65 | 0.79 | 1.30 | 1.24 |

The unit of the mixing amounts is part by mass except for the component (b) (provided that the solution and the dispersion are shown in terms of solid content).
The mixing amount of the component (b) is shown in the parentheses in terms of molar number per 1 mol of the component (a).
The mixing amount of the component (c) is % by volume with resect to the total solid content of the thermosetting resin composition.

In the components shown in Table 3, the biphenyl aralkyl type maleimide and the biphenyl skeleton-containing compound 1 are shown below, and the other components are the same as in Tables 1 and 2.

[Component (a)]
Biphenyl aralkyl type maleimide: "MIR-3000" (trade name, available from Nippon Kayaku Co., Ltd., maleimide group equivalent: 339 g/eq)

[Component (b)]
Biphenyl skeleton-containing compound 1 (see the structural formula below), melting point: 185° C.

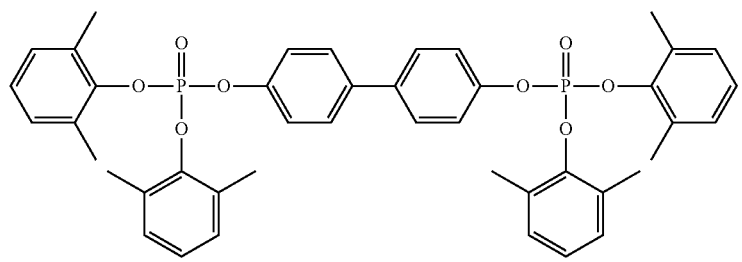

biphenyl skeleton-containing compound 1

The compound corresponds to the general formula (1), wherein $X^{b1}$ represents a single bond, $R^{b1}$ and $R^{b2}$ represent oxygen atom-containing groups, and m and n represent 1.

It is understood from the comparison between Examples A18 to A25 and Comparative Example A8 in Table 3 that in the case where 4,4'-diethylbiphenyl or the biphenyl skeleton-containing compound 1 is mixed in 2,2-bis[4-(4-maleimidophenoxy)-phenyl]propane or the biphenyl aralkyl type maleimide, the high frequency characteristics are enhanced, the moisture absorption rate is low, and the high frequency characteristics after the hygroscopic test are also excellent.

On the other hand, it is understood from the results of Comparative Example A9 that even in the case where the maleimide compound (a) having at least one N-substituted maleimide group has a biphenyl skeleton in the structure thereof, the enhancing effect of the high frequency characteristics is poor, and the deterioration of the high frequency characteristics after the hygroscopic test is large.

Examples B1 to B7 and Comparative Examples B1 to B3

Copper-attached resin plates were produced by performing the same procedures as in Examples A1 to A7 and Comparative Examples A1 to A3 except that fused spherical silica (average particle diameter: 0.5 μm) was mixed as the inorganic filler (c) with the thermosetting resin composition. The resulting copper-attached resin plates were evaluated for the high frequency characteristics and the thermal expansion coefficient. The results are shown in Table 4.

TABLE 4

|  |  |  | Example B | | | | | |
|---|---|---|---|---|---|---|---|---|
|  |  |  | 1 | 2 | 3 | 4 | 5 | 6 |
| Thermo-setting resin composition | (a) | 2,2-bis [4-(4-Maleimidophenoxy)-phenyl]propane | 100 | 100 | 100 | 100 | 100 | 100 |
|  | Substitute component | Epoxy resin |  |  |  |  |  |  |
|  |  | Phenol resin |  |  |  |  |  |  |
|  | (b) | 4,4'-Diethylbiphenyl | (0.025) | (0.05) | (0.10) | (0.20) | (0.30) | (0.60) |
|  | (c) | Fused spherical silica | 30 vol. % | 30 vol. % | 30 vol. % | 30 vol. % | 30 vol. % | 30 vol. % |
|  | (g) | 4,4'-(1,3-Phenylenediisopropylidene)-bisaniline | 20 | 20 | 20 | 20 | 20 | 20 |
|  | Additional component | α,α-bis(t-Butylperoxy-m-isopropyl)benzene | 0.3 | 0.3 | 0.3 | 0.3 | 0.3 | 0.3 |
|  |  | 2-Ethyl-4-methylimidazole |  |  |  |  |  |  |
| Evaluation results | (1) High frequency characteristics (10 GHz) | Relative permeability (Dk) | 3.00 | 2.98 | 2.97 | 2.96 | 2.98 | 2.98 |
|  |  | Dielectric tangent (Df) | 0.0029 | 0.0027 | 0.0024 | 0.0022 | 0.0021 | 0.0020 |
|  | (2) Thermal expansion coefficient | ppm/K | 43 | 43 | 44 | 42 | 43 | 43 |

|  |  |  | Example B | Comparative Example B | | |
|---|---|---|---|---|---|---|
|  |  |  | 7 | 1 | 2 | 3 |
| Thermo-setting resin composition | (a) | 2,2-bis [4-(4-Maleimidophenoxy)-phenyl]propane | 100 | 100 |  |  |
|  | Substitute component | Epoxy resin |  |  | 100 | 100 |
|  |  | Phenol resin |  |  | 36 | 36 |
|  | (b) | 4,4'-Diethylbiphenyl | (0.90) | — | — | (0.3) |
|  | (c) | Fused spherical silica | 30 vol. % | 30 vol. % | 30 vol. % | 30 vol. % |
|  | (g) | 4,4'-(1,3-Phenylenediisopropylidene)-bisaniline | 20 | 20 | — | — |
|  | Additional component | α,α-bis(t-Butylperoxy-m-isopropyl)benzene | 0.3 | 0.3 |  |  |
|  |  | 2-Ethyl-4-methylimidazole |  |  | 0.3 | 0.3 |
| Evaluation results | (1) High frequency characteristics (10 GHz) | Relative permeability (Dk) | 2.97 | 3.04 | 3.28 | 3.27 |
|  |  | Dielectric tangent (Df) | 0.0020 | 0.0035 | 0.0094 | 0.0094 |
|  | (2) Thermal expansion coefficient | ppm/K | 44 | 43 | 53 | 54 |

The unit of the mixing amounts is part by mass except for the component (b) (provided that the solution and the dispersion are shown in terms of solid content).
The mixing amount of the component (b) is shown in the parentheses in terms of molar number per 1 mol of the component (a).
The mixing amount of the component (c) is % by volume with resect to the total solid content of the thermosetting resin composition.

The components shown in Table 4 are the same as the components described in Table 1. The inorganic filler (c) is fused spherical silica having an average particle diameter of 0.5 μm.

It is understood from the comparison between Examples B1 to B7 and Comparative Example B1 in Table 4 that in the case where 4,4'-diethylbiphenyl is mixed in the thermosetting resin composition containing 2,2-bis[4-(4-maleimidophenoxy)-phenyl]propane and the inorganic filler (c), the high frequency characteristics are enhanced while having low thermal expansion property.

On the other hand, it is understood from the comparison between Comparative Example B2 and Comparative Example B3 that in the case where 4,4'-diethylbiphenyl is mixed in the thermosetting resin composition containing the epoxy resin (and the phenol resin), substantially no enhancing effect of the high frequency characteristics is obtained.

Examples B8 to B12 and Comparative Examples B4 and B5

Copper-attached resin plates were produced by performing the same procedures as in Example B1 except that the kinds and the mixing amounts of the components were changed as shown in Table 5. The resulting copper-attached resin plates were evaluated for the high frequency characteristics, the high frequency characteristics after the hygroscopic test, and the thermal expansion coefficient. The results are shown in Table 5.

TABLE 5

|  |  |  | Example B | | | | | Comparative Example B | |
|---|---|---|---|---|---|---|---|---|---|
|  |  |  | 8 | 9 | 10 | 11 | 12 | 4 | 5 |
| Thermo-setting resin composition | (a) | 2,2-bis[4-(4-Maleimidophenoxy)-phenyl]propane | 100 | 100 | 100 | 100 | 100 | 100 | |
|  |  | Biphenyl aralkyl type maleimide |  |  |  |  |  |  | 100 |
|  | (b) | 4,4'-Diethylbiphenyl |  |  |  |  | (0.2) |  |  |
|  |  | Biphenyl skeleton-containing compound 1 | (0.6) | (0.6) | (0.6) | (0.6) |  |  |  |
|  | (c) | Fused spherical silica | 10 vol. % | 20 vol. % | 35 vol. % | — | — | — | — |
|  | (g) | 4,4'-(1,3-Phenylenediisopropylidene)-bisaniline | 24 | 24 | 24 | 24 | 24 | 24 | 24 |
|  | (Additional component) | α,α-bis(t-Butylperoxy-m-isopropyl)benzene | 1.3 | 1.3 | 1.3 | 1.3 | 1.3 | 1.3 | 1.3 |
| Evaluation results | (1) High frequency characteristics (10 GHz) | Relative permeability (Dk) | 2.82 | 2.89 | 2.94 | 2.75 | 2.82 | 2.85 | 2.83 |
|  |  | Dielectric tangent (Df) | 0.0020 | 0.0020 | 0.0019 | 0.0021 | 0.0035 | 0.0043 | 0.0041 |
|  |  | Relative permeability (Dk) after hygroscopic test | 2.91 | 2.96 | 3.03 | 2.86 | 3.00 | 3.18 | 3.13 |
|  |  | Change amount of Dk before and after hygroscopic test | 0.09 | 0.07 | 0.09 | 0.11 | 0.19 | 0.33 | 0.29 |
|  |  | Dielectric tangent (Df) after hygroscopic test | 0.0065 | 0.0060 | 0.0053 | 0.0070 | 0.0099 | 0.0147 | 0.0141 |
|  |  | Change amount of Df before and after hygroscopic test | 0.0045 | 0.0040 | 0.0034 | 0.0049 | 0.0063 | 0.0104 | 0.0099 |
|  | (2) Thermal expansion coefficient | ppm/K | 77 | 68 | 56 | 85 | 88 | 81 | 80 |

The unit of the mixing amounts is part by mass except for the component (b) (provided that the solution and the dispersion are shown in terms of solid content).
The mixing amount of the component (b) is shown in the parentheses in terms of molar number per 1 mol of the component (a).
The mixing amount of the component (c) is % by volume with resect to the total solid content of the thermosetting resin composition.

The components shown in Table 5 are the same as the components described in Tables 3 and 4.

It is understood from the comparison between Examples B8 to B12 and Comparative Example B4 in Table 5 that in the case where 4,4'-diethylbiphenyl or the biphenyl skeleton-containing compound 1 is mixed in the thermosetting resin composition containing 2,2-bis[4-(4-maleimidophenoxy)-phenyl]propane and depending on necessity the inorganic filler (c), the high frequency characteristics are enhanced. In particular, it is also understood that for the thermosetting resin composition containing the inorganic filler (c), low thermal expansion property is also achieved.

On the other hand, it is understood from the results of Comparative Example B5 that even in the case where the maleimide compound (a) having at least one N-substituted maleimide group has a biphenyl skeleton in the structure thereof, the enhancing effect of the high frequency characteristics is poor.

Production Example 1

Production of Silicone-Modified Maleimide Resin (X-1)

A silicone-modified maleimide resin as a reaction product of the components (a1) to (a3) was produced according to the following method.

In a heatable and coolable reaction vessel having a capacity of 2 L equipped with a thermometer, an agitation device, and a moisture metering vessel having a reflux condenser, 58 g of a both-end amino-modified silicone compound (X-22-161B, trade name, available from Shin-Etsu Chemical Co., Ltd., functional group equivalent of amino group: 800 g/mol, component (a3')), 77 g of 4,4'-(1, 3-phenylenediisopropylidene)bisaniline (available from Tokyo Kasei Kogyo Co., Ltd., component (a3)), 650 g of bis(4-maleimidophenyl)methane (BMI, trade name, available from K-I Chemical Industry, Co., Ltd., component (a1)), and 1,160 g of propylene glycol monomethyl ether were charged and reacted at 110° C. for 5 hours, so as to provide a solution containing a silicone-modified maleimide resin (X-1).

Examples C1 to C3 and Comparative Examples C1 to C3

Copper-attached resin plates were produced by performing the same procedures as in Example A1 except that the kinds and the mixing amounts of the components were changed as shown in Table 6. The resulting copper-attached resin plates were evaluated for the high frequency characteristics and the storage elastic modulus. The results are shown in Table 6.

TABLE 6

|  |  |  | Example C | | | Comparative Example C | | |
|---|---|---|---|---|---|---|---|---|
|  |  |  | 1 | 2 | 3 | 1 | 2 | 3 |
| Thermo-setting resin composition | (a) Substitute component | Silicone-modified maleimide resin (X-1) | 100 | 100 | 100 | 100 | | |
|  |  | Epoxy resin | | | | | 100 | 100 |
|  |  | Phenol resin | | | | | 36 | 36 |
|  | (b) (Additional components) | 4,4'-Diethylbiphenyl | (0.025) | (0.05) | (0.10) | — | — | (0.3) |
|  |  | α,α-bis(t-Butylperoxy-m-isopropyl)benzene | 0.3 | 0.3 | 0.3 | 0.3 | | |
|  |  | 2-Ethyl-4-methylimidazole | | | | | 0.3 | 0.3 |
| Evaluation results | (1) High frequency characteristics (10 GHz) | Relative permeability (Dk) | 2.82 | 2.82 | 2.78 | 2.86 | 3.11 | 3.09 |
|  |  | Dielectric tangent (Df) | 0.0106 | 0.0096 | 0.0079 | 0.0129 | 0.0130 | 0.0128 |
|  | (4) Storage elastic modulus | GPa | 2.6 | 2.7 | 2.7 | 2.5 | 3.4 | 3.4 |

The unit of the mixing amounts is part by mass except for the component (b) (provided that the solution is shown in terms of solid content).
The mixing amount of the component (b) is shown in the parentheses in terms of molar number per 1 mol of the component (a).

In the components shown in Table 6, the silicone-modified maleimide resin (X-1) is obtained in Production Example 1, and the other components are the same as in Table 1.

It is understood from the comparison between Examples C1 to C3 and Comparative Example C1 in Table 6 that in the case where 4,4'-diethylbiphenyl is mixed in the silicone-modified maleimide resin (X-1), excellent low warpage property is obtained due to the low elastic modulus, and the high frequency characteristics are also enhanced.

On the other hand, it is understood from the comparison between Comparative Example C2 and Comparative Example C3 that even in the case where 4,4'-diethylbiphenyl is mixed in the epoxy resin (and the phenol resin), the enhancing effect of the high frequency characteristics is poor.

The invention claimed is:

1. A thermosetting resin composition comprising:
    a maleimide compound (a) having at least one N-substituted maleimide group, and
    a compound (b) represented by the following general formula (1) exhibiting no reactivity with the maleimide group of the component (a):

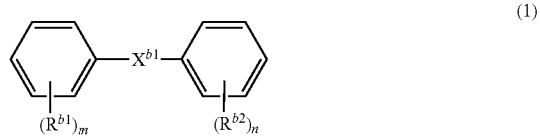

(1)

wherein in the general formula (1), $X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5,
    wherein substituents that the groups in the general formula (1) can have are substituents exhibiting no reactivity with the maleimide group of the component (a) at 200° C. or less.

2. The thermosetting resin composition according to claim 1, wherein the component (a) contains a maleimide compound (a1) having at least two N-substituted maleimide groups.

3. The thermosetting resin composition according to claim 1, wherein the component (a) contains a reaction product of a maleimide compound (a1) having at least two N-substituted maleimide groups, and at least one kind selected from the group consisting of a monoamine compound (a2) and an amine compound (a3) having at least two amino groups.

4. The thermosetting resin composition according to claim 2, wherein the component (a1) is a maleimide compound having an aliphatic hydrocarbon group between nitrogen atoms of optional two N-substituted maleimide groups among the multiple N-substituted maleimide groups (provided that no aromatic hydrocarbon group exists), or a maleimide compound having an aromatic hydrocarbon group between nitrogen atoms of optional two N-substituted maleimide groups among the multiple N-substituted maleimide groups.

5. A thermosetting resin composition comprising:
    a maleimide compound (a) having at least one N-substituted maleimide group, wherein the component (a) contains a reaction product of a maleimide compound (a1) having at least two N-substituted maleimide groups and a silicone compound (a3') having at least two amino groups, and
    a compound (b) represented by the following general formula (1) exhibiting no reactivity with the maleimide group of the component (a):

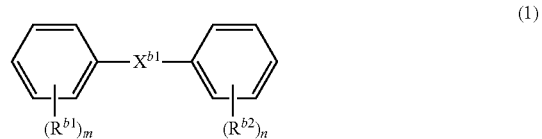

(1)

wherein in the general formula (1), $X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5.

6. The thermosetting resin composition according to claim 5, wherein the component (a) is a reaction product of the component (a1), the component (a3'), and an amine compound (a3) having at least two amino groups (provided that the component (a3') is excluded).

7. The thermosetting resin composition according to claim 1, wherein the component (b) is represented by the following general formula (1'):

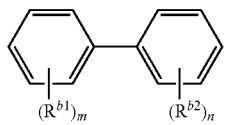
(1')

wherein in the general formula (1'), $R^{b1}$, $R^{b2}$, m, and n have the same meanings as in the general formula (1).

8. The thermosetting resin composition according to claim 1, wherein the component (b) has a boiling point of 260° C. or more under one atmosphere (101.325 kPa).

9. The thermosetting resin composition according to claim 1, wherein the component (b) is at least one kind selected from the group consisting of diethylbiphenyl and benzylbiphenyl.

10. The thermosetting resin composition according to claim 1, wherein in the general formula (1), $R^{b1}$ and $R^{b2}$ represent oxygen atom-containing groups.

11. The thermosetting resin composition comprising:
a maleimide compound (a) having at least one N-substituted maleimide group, and
a compound (b) represented by the following general formula (1) exhibiting no reactivity with the maleimide group of the component (a);

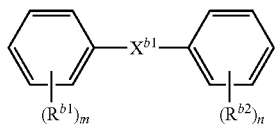
(1)

wherein in the general formula (1), $X^{b1}$ represents a single bond or a substituted or unsubstituted aliphatic hydrocarbon group having 1 to 5 carbon atoms; $R^{b1}$ and $R^{b2}$ each independently represent a substituted or unsubstituted aliphatic hydrocarbon group having 1 to 10 carbon atoms, a substituted or unsubstituted aromatic hydrocarbon group having 6 to 18 ring carbon atoms, a substituted or unsubstituted heterocyclic aromatic hydrocarbon group having 5 to 20 ring atoms, an oxygen atom-containing group, or a group containing a combination of these groups; and m and n each independently represent an integer of 0 to 5, wherein the thermosetting resin composition has a content of the component (b) of 0.001 to 1.0 mol per 1 mol of the component (a).

12. The thermosetting resin composition according to claim 1, wherein the thermosetting resin composition further comprises an inorganic filler (c).

13. The thermosetting resin composition according to claim 1, wherein the thermosetting resin composition further comprises a thermosetting resin (d).

14. The thermosetting resin composition according to claim 1, wherein the thermosetting resin composition further comprises a curing accelerator (e).

15. The thermosetting resin composition according to claim 1, wherein the thermosetting resin composition further comprises a monoamine compound (f).

16. The thermosetting resin composition according to claim 1, wherein the thermosetting resin composition further comprises an amine compound (g) having at least two amino groups.

17. A prepreg comprising a semi-cured material of the thermosetting resin composition according to claim 1.

18. A laminate comprising a cured material of the prepreg according to claim 17.

19. A printed wiring board comprising the laminate according to claim 18, and a circuit formed thereon.

20. A high-speed communication compatible module comprising the printed wiring board according to claim 19.

* * * * *